United States Patent
Osanai et al.

(10) Patent No.: US 6,285,444 B1
(45) Date of Patent: Sep. 4, 2001

(54) POSITIONING SYSTEM AND POSITION MEASURING METHOD FOR USE IN EXPOSURE APPARATUS

(75) Inventors: Eiji Osanai, Yokohama; Kotaro Akutsu, Sohka, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/314,170

(22) Filed: May 19, 1999

(30) Foreign Application Priority Data

May 21, 1998 (JP) .................................................. 10-139740
Mar. 26, 1999 (JP) .................................................. 11-083495

(51) Int. Cl.[7] ............................. G03B 27/42; G03B 27/58
(52) U.S. Cl. .............................................. 355/72; 355/53
(58) Field of Search .................................. 355/53, 72, 76; 356/399, 400, 401; 318/625, 632, 628, 687; 250/548

(56) References Cited

U.S. PATENT DOCUMENTS

| | | | |
|---|---|---|---|
| 4,891,526 | * 1/1990 | Reeds | 250/442.1 |
| 5,040,431 | 8/1991 | Sakino et al. | 74/479 |
| 5,122,660 | * 6/1992 | Yoshii et al. | 250/237 |
| 5,280,677 | 1/1994 | Kubo et al. | 33/568 |
| 5,363,196 | 11/1994 | Cameron | 356/358 |
| 5,369,486 | * 11/1994 | Matsumoto et al. | 356/349 |
| 5,418,611 | * 5/1995 | Huang et al. | 356/141.2 |
| 5,563,708 | * 10/1996 | Nakai | 356/353 |
| 5,610,686 | * 3/1997 | Osanai | 355/72 |
| 5,764,361 | * 6/1998 | Kato et al. | 356/358 |
| 5,801,832 | * 9/1998 | Van Den Brink | 356/358 |
| 5,815,594 | * 9/1998 | Tanaka | 382/151 |
| 5,858,587 | 1/1999 | Yamane et al. | 430/22 |
| 5,875,031 | * 2/1999 | Owa | 356/358 |
| 5,909,272 | 6/1999 | Osanai et al. | 355/53 |
| 5,933,215 | 8/1999 | Inoue et al. | 355/53 |
| 5,939,852 | 8/1999 | Akutsu et al. | 318/640 |
| 5,995,225 | * 11/1999 | Naraki et al. | 356/358 |
| 6,020,964 | 2/2000 | Loopstra et al. | 356/358 |
| 6,049,377 | * 4/2000 | Lau et al. | 356/73 |

FOREIGN PATENT DOCUMENTS 5-315221   11/1993   (JP).

* cited by examiner

Primary Examiner—Russell Adams
Assistant Examiner—Hung Henry Nguyen
(74) Attorney, Agent, or Firm—Fitzpatrick, Cella, Harper & Scinto

(57) ABSTRACT

A positioning system includes a movable member being movable along a reference plane containing first and second directions, and a position measuring device for measuring positional information related to the movable member, wherein the movable member includes an element having a reflection surface inclined with respect to the reference plane, and wherein the position measuring device includes a measuring system for causing a measurement beam to be reflected by the inclined reflection surface and for detecting positional information related to the movable member with respect to a direction intersecting the reference plane.

63 Claims, 29 Drawing Sheets

POSITIONING SYSTEM AND POSITION MEASURING METHOD FOR USE IN EXPOSURE APPARATUS

FIELD OF THE INVENTION AND RELATED ART

This invention relates to a positioning system for carrying and accurately positioning a workpiece, and to an exposure method or a device manufacturing method using such a positioning system. In another aspect, the invention is concerned with a position measuring method for accurately measuring the position of an article.

FIG. 29 shows an example of a conventional positioning system to be used in a semiconductor exposure apparatus, for example.

Denoted in the drawing at 104 is a wafer chuck for carrying a wafer (not shown) thereon, and denoted at 105 is a top stage of a stage system for supporting the wafer chuck 104. It can be moved by means of guides and actuators (not shown) in X- and Y-axis directions with long strokes, and also it can be moved in a Z-axis direction and rotated in rotational directions θx, θy and θz with short strokes.

Denoted at 130 is a control box which includes a computing circuit and a driving circuit, for example. Denoted at 131a is an X reflection surface mounted to the top stage 105, and denoted at 132b is a Y mirror reflection surface mounted to the top stage. Denoted at 133a, 133b and 133c are interferometers for measurement with respect to the X direction. Denoted at 134a and 134b are interferometers for measurement with respect to the Y direction. These interferometers 133a–133c and 134a–134b are fixedly supported by a base (not shown) which functions as a reference for the measurement.

Conventionally, for the positioning of a system called a positioning system, position detection is first made by projecting laser light to predetermined positions on a reflection mirror mounted on a stage whereby positional change information about the beam incidence positions along the beam incidence direction is produced on the basis of reflected light. Based on the result of this position detection, the positioning control is accomplished. As regards the method of detecting a rotational direction of the top stage 105, it can be detected by detecting positional change information about the beam incidence positions at two locations along the same axis direction. Namely, in the measuring system of FIG. 29, position detection with respect to the Y-axis direction and θx direction is performed on the basis of positional change information detected by using the interferometers 133a, 133b and 133c. Then, positioning control with respect to five axial directions, excluding the Z-axis, is accomplished on the basis of the position detection information using laser interferometers.

As regards the position detecting means for the Z-axis direction, generally, it comprises a linear encoder or an electro-capacitance sensor provided within the stage to be moved, and the positioning control with respect to the Z-axis direction is performed on the basis of the result of detection by the detecting means.

In such a positioning system using Z-axis position detecting means as described above, positional information about the top stage with respect to the Z direction is detected by using a sensor mounted on the stage which is to be moved with a long stroke. This causes the following inconveniences.

(1) Since the positional information cannot be directly detected from the base (measurement reference) on which the laser interferometer is mounted, a plurality of sensors have to be disposed in series to perform the measurement. The measurement is, therefore, influenced by the precision of guide means, causing a measurement error.

(2) Inertia during stage acceleration and deceleration or the weight of the stage itself, acting as a movement load, will cause deformation of the stage guide or deformation of the base or the structure supporting the stage. This causes a measurement error and interferes with high precision positioning.

SUMMARY OF THE INVENTION

It is an object of the present invention to provide a positioning system with long-stroke movability in X and Y directions, by which measurement in the Z-axis direction is enabled in a simple structure and by which high precision positioning is assured.

In accordance with an aspect of the present invention, there is provided a positioning system, comprising: a movable member being movable along a reference plane containing first and second directions; and a position measuring device for measuring positional information related to the movable member; wherein the movable member includes an element having a reflection surface inclined with respect to the reference plane; and wherein said position measuring device includes measuring means for causing a measurement beam to be reflected by said inclined reflection surface and for detecting positional information related to the movable member with respect to a direction intersecting the reference plane.

In one preferred form of this aspect of the present invention, the inclined reflection surface includes a reflection surface portion for reflecting the measurement beam, projected thereto from said position measuring device substantially parallel to the reference plane, in a direction intersecting the reference plane.

In one preferred form of this aspect of the present invention, the positioning system further comprises a fixed mirror mounted on a stationary member and having a reflection surface with a direction of a normal thereto extending to intersect the reference plane, wherein the measurement beam reflected by said inclined reflection surface is then reflected by said fixed mirror backwardly along the beam path.

In one preferred form of this aspect of the present invention, the measurement beam reflected by said inclined reflection surface advances in a direction away from the reference plane.

In one preferred form of this aspect of the present invention, the measurement beam reflected by said inclined reflection surface advances in a direction close to the reference plane.

The position measuring device may detect the positional information related to the movable member with respect to a direction intersecting the reference plane, on the basis of a reflection beam reflected by the fixed mirror.

The inclined reflection surface may comprise a reflection surface inclined by 45 deg. with respect to the reference plane.

The direction intersecting the reference plane may be substantially orthogonal to the reference plane.

The measurement beam impinging on said inclined reflection surface and a reflected beam reflected by said inclined reflection surface may define an acute angle therebetween.

A measurement beam substantially parallel to the reference plane may be used to detect information about the movable member with respect to six axial directions.

The movable member may include a first mirror to be used for position measurement to the movable member with respect to the first direction, and a second mirror to be used for position measurement to the movable member with respect to the second direction.

The first mirror may serve to reflect a measurement beam, substantially parallel to the first direction, in a direction substantially parallel to the first direction.

The second mirror may serve to reflect a measurement beam, substantially parallel to the second direction, in a direction substantially parallel to the second direction.

The first and second directions may intersect with each other substantially at a right angle.

The inclined reflection surface may be provided integrally with at least one of said first and second mirrors.

The position measuring device may include first and second measuring means for performing measurement in relation to two different locations on said first mirror, third and fourth measuring means for performing measurement in relation to two different locations on said second mirror, fifth measuring means for performing measurement in relation to a third location placed out of a straight line connecting the two locations on said first mirror, and sixth measuring means for detecting a reflection beam coming via said inclined reflection surface.

The position measuring means may include first and second measuring means for detecting first and second measurement beams, positioned up and down and substantially parallel to each other, third and fourth measuring beams, positioned up and down and substantially parallel to each other, fifth measuring means for detecting a measurement beam for performing position measurement in relation to another location on said first mirror, and sixth measuring means for detecting a reflection beam coming via said inclined reflection surface.

On the basis of the results of the detection with said first to sixth measuring means, positional information and rotational information related to the movable object with respect to a direction along the reference plane, rotational information in a direction inclined with respect to the reference plane, and positional information in a direction intersecting the reference plane may be detected.

The movable member may include a plurality of elements each having said inclined reflection surface.

Measurement beams projected to said inclined surfaces may be all substantially parallel to the reference plane.

The position measuring device may selectively measure a reflection beam from any one of said inclined reflection surfaces.

The position measuring device may selectively measure a reflection beam from any one of said inclined reflection surfaces, on the basis of positional information of the movable member.

Any one of the measurement beams projected or to be projected on said inclined reflection surfaces may be blocked.

The position measuring device may include measuring means for performing measurement in relation to different locations on said inclined reflection surface.

The number of the different locations may be at least three.

Reflection beam measurement may be performed by use of different locations on said inclined reflection surface, such that positional information of the movable member in a direction inclined with respect to the reference plane and a rotational direction in a direction inclined with respect to the reference plane are detected.

The inclined reflection surface may include a first inclined reflection surface provided integrally with said first mirror, and a second inclined reflection surface provided integrally with said second mirror.

The position measuring device may include first measuring means for performing measurement in relation to said first mirror, second measuring means for performing measurement in relation to said second mirror, third measuring means for performing measurement in relation to a different location on one of said first and second mirrors, and fourth, fifth and sixth measuring means for performing measurement in relation to three different locations on said inclined reflection surface.

The position measuring means may include first, second and third measuring means for detecting positional information and rotational information of the movable member in a direction along the reference plane, and fourth, fifth and sixth measuring means for performing measurement by use of said inclined reflection surfaces and for detecting positional information of the movable member in a direction intersecting the reference plane and rotational information in a direction inclined with respect to the reference plane.

The first and fourth measuring means may detect first and fourth measurement beams, positioned up and down and substantially parallel to each other, wherein said second and fifth measuring means may detect second and fifth measurement beams, positioned up and down and substantially parallel to each other, and wherein said third and sixth measuring means may detect third and sixth measurement beams, positioned up and down and substantially parallel to each other.

In accordance with another aspect of the present invention, there is provided a positioning system, comprising: a movable member being movable in a predetermined direction; an element mounted on the movable member and having a reflection surface; and a position measuring device for measuring the position of the movable member; wherein said position measuring device includes measuring means for projecting a measurement beam onto the reflection surface in a direction different from a normal thereto to thereby detect positional information about the movable member with respect to the direction of reflection of the measurement beam.

In one preferred form of this aspect of the present invention, the reflection surface serves to reflect a measurement beam, substantially parallel to the predetermined direction, in a direction different from the predetermined direction.

In one preferred form of this aspect of the present invention, the positioning system further comprises a fixed mirror mounted on a stationary portion and having a reflection surface with a normal thereto extending in a direction of the measurement beam reflected by said element with a reflection surface, wherein the reflected measurement beam is then reflected by said fixed mirror backwardly along the beam path.

The position detecting device may detect positional information of the movable member with respect to a direction different from the predetermined direction, on the basis of a reflected beam reflected by said fixed mirror.

The position detecting device may detect positional information of the movable member with respect to a direction orthogonal to the predetermined detection.

The direction different from the direction of the normal may be a vertical direction.

The predetermined direction may be a direction along a horizontal plane containing the first and second directions.

In accordance with a further aspect of the present invention, there is provided an exposure apparatus having a positioning system as recited above.

In one preferred form of this aspect of the present invention, the positioning system is provided in portion of a wafer stage.

In one preferred form of this aspect of the present invention, the apparatus further comprises a barrel support member for supporting a projection optical system, wherein said positioning system is supported by said barrel support member.

In one preferred form of this aspect of the present invention, the apparatus further comprises a fixed mirror for reflecting a reflection beam from the inclined surface backwardly along its beam path, wherein said fixed mirror is supported by said barrel support member.

In one preferred form of this aspect of the present invention, the apparatus further comprises a fixed mirror for reflecting a reflection beam from the inclined reflection surface backwardly along its beam path, wherein said fixed mirror is supported by a base for supporting the movable member.

The apparatus may further comprise a base having the reference plane and being supported integrally with said barrel support member through a vibration isolating mechanism.

The apparatus may further comprise a base having the reference plane and being supported independently through said barrel support member and a vibration isolating mechanism.

In accordance with a still further aspect of the present invention, there is provided a device manufacturing method, comprising the steps of:
providing an exposure apparatus as recited above; and
transferring a reticle pattern to a wafer with the exposure apparatus.

In accordance with a yet further aspect of the present invention, there is provided a position measuring method for measuring the position of a movable member being movable along a reference plane, said method comprising the steps of:
projecting a measurement beam onto an optical element mounted on the movable member, along a direction substantially parallel to the reference plane: and measuring the position of the movable member with respect to a direction perpendicular to the reference plane, by use of a beam deflected by the optical element in a direction intersecting the reference plane.

In one preferred form of this aspect of the present invention, the method further comprises reflecting, with a fixed reflecting portion, the deflected beam backwardly along the same path, and measuring the position of the movable member with respect to a direction perpendicular to the reference plane.

In one preferred form of this aspect of the present invention, the optical element includes a mirror member having an inclined reflection surface.

The optical element may include a diffraction grating.

A phase change of diffraction light produced by the diffraction grating may be measured to thereby measure the position of the movable member with respect to a direction perpendicular to the reference plane.

The movable member may be provided with a plurality of optical elements each as aforesaid, and wherein measurement is selectively made with use of any one of the optical elements in accordance with positional information of the movable member.

The movable member may be provided with a plurality of optical elements each as aforesaid, and wherein positions at plural locations on the movable member with respect to a direction perpendicular to the reference plane are measured, whereby rotational information of the movable member in a direction inclined with respect to the reference plane and positional information in a direction perpendicular thereto are detected.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the accompanying drawings.

Embodiment 1

Figure 1:
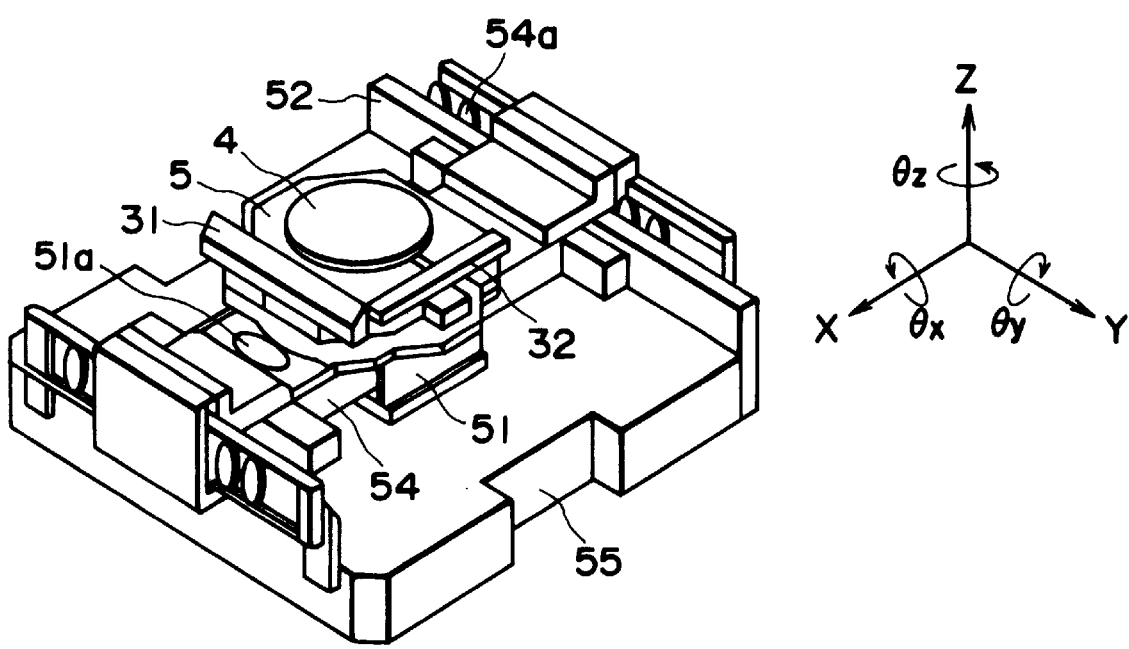
FIG. 1 is a perspective view of a wafer stage according to a first embodiment of the present invention.

FIG. 1 shows a six-axis wafer stage according to a first embodiment of the present invention. Denoted in the drawing at 55 is a stage base (surface base table) having a reference plane (X-Y plane) on its top surface. Denoted at 54 is a Y stage which can be moved in a Y direction by a Y linear motor 54a while being guided in the Y direction by a Y guide 52. Denoted at 51 is an X stage which can be moved in an X direction by an X linear motor 51a, relative to the Y stage 54, while being guided in the X direction by an X guide provided on the Y stage 54. Both of the X stage 51 and the Y stage 54 are supported out of contact to the reference plane of the base 55 through static bearing means (not shown).

Mounted on the X stage 51 being movable in the X and Y directions is a four-axis operation (Z, θx, θy and θz) top stage which is a movable member. Denoted at 4 is a wafer chuck mounted on the top stage 5, for carrying thereon a wafer (not shown).

Figure 2:
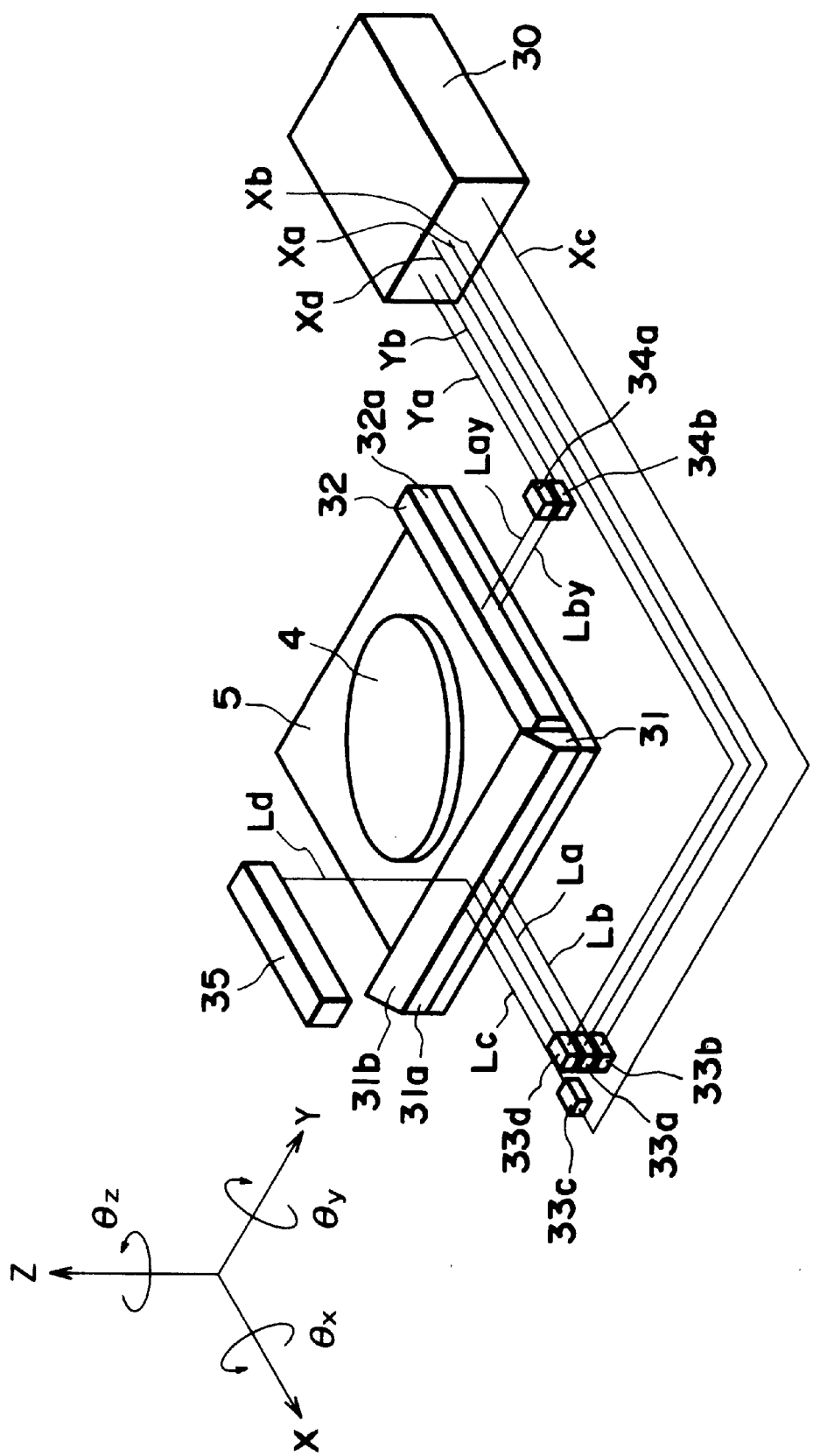
FIG. 2 is a perspective view of a measuring system according to the first embodiment.

FIG. 2 is a perspective view of a measuring system (position measuring device) with a laser interferometer (position measuring means) which constitutes a major portion of this embodiment.

Denoted in the drawing at 4 is wafer chuck for carrying a wafer (not shown) thereon. Denoted at 5 is a top stage for supporting the wafer chuck 4 thereon. The top stage can be moved by guide and actuator means (not shown) in X-axis and Y-axis directions (first and second directions) with long strokes. Also, it can be moved in a Z-axis direction and in rotational directions θx, θy and θz with short strokes.

Denoted at 30 is a control box having a computing circuit, a driving circuit and so on accommodated therein. Denoted at La, Lb, Lc, Ld, Lay, and Lby are laser lights (measurement beams) for position management. Denoted at 31 is an X mirror being mounted on the top stage 5 and having an integral structure of mirrors with reflection surfaces 31a and 31b. The reflection surface 31a comprises an optical element disposed perpendicularly to the X-axis direction. The reflection surface 31b comprises an optical element disposed with a tilt of 45 deg. in the θy direction, with respect to the X-Y plane, and it provides an inclined reflection surface. Denoted at 32 is a Y mirror mounted on the top stage 5, and it has a reflection surface 32a disposed perpendicularly to the Y-axis direction.

Denoted at 32a, 33b, and 33c are interferometers (position measuring means) for measurement with respect to the X direction. These interferometers function to project laser lights, each being parallel to the X direction, upon predetermined locations on the reflection surface 31a, and, positional change information about the top stage 5 with respect to the beam incidence direction (X-axis direction) can be detected on the basis of reflected lights from the surface 31a. Denoted at 34a and 34b are interferometers for measurement with respect to the Y direction. They serve to project laser lights, each being parallel to the Y direction, upon predetermined locations on the reflection surface 32a, and, positional change information of the top stage 5 with respect to the beam incidence direction (Y-axis direction) can be detected on the basis of reflected lights from the surface 32a.

Denoted at 33d is an interferometer disposed in alignment with the interferometer 33a with respect to the Z-axis direction. It projects laser light to the reflection surface 31b along the X-axis direction.

Elements 32a, 33b and 33d are interferometers for detecting laser lights La, Lb and Ld, positioned in line along the Z-axis direction and being parallel to each other. Elements 34a and 34b are interferometers for detecting laser lights Lay and Lby, positioned in line along the Z-axis direction and being parallel to each other.

These interferometers 32a, 32b, 33c, 33d, 34a and 34b are fixedly supported by a support structure (not shown) which provides a measurement reference.

Denoted at 35 is a fixed mirror having a reflection mirror surface in a negative Z direction, for reflecting laser light, coming from the interferometer 33d and being deflected by the reflection surface 31b in the Z-axis direction, backwardly along its on-coming beam path. The fixed mirror 35 has a length (dimension in the X-axis direction) corresponding to the movement amount of the top stage 5 in the X-axis direction, and it is fixedly supported by the unshown support structure which provides a measurement reference.

The laser interferometer means described above functions to detect positional change information (amount and speed of shift, for example). It has a well-known structure and, therefore, a description of details of its structure will be omitted.

The positions of the mirrors 31 and 32, that is, the initial position of the top stage 5 has been memorized in the control box 30. The current position of the top stage 5 can be obtained by adding, to this initial position, the integrated value of displacements of the mirrors 31 and 32 measured by laser interferometers. Position measurement to the stage in the X and Y directions can be performed by use of the laser interferometers 33a and 34a. Also, rotational amount measurement to the stage with respect to the θz direction can be performed by detecting any difference between detected values of the laser interferometers 33a and 33c and by processing it within the control box 30. Rotational amount measurement to the stage with respect to the θy direction can be performed by detecting any difference between detected values of the laser interferometers 33a and 33b and by processing it within the control box 30. Rotational amount measurement to the stage with respect to θx direction can be performed by detecting any difference between detected values of the laser interferometers 34a and 34b and by processing it within the control box 30.

Position measurement to the stage with respect to the Z direction can be performed by detecting any difference between detected values of the laser interferometers 33a (or 33b) and by processing it inside the control box 30. Details of this will be described below.

Figure 3:
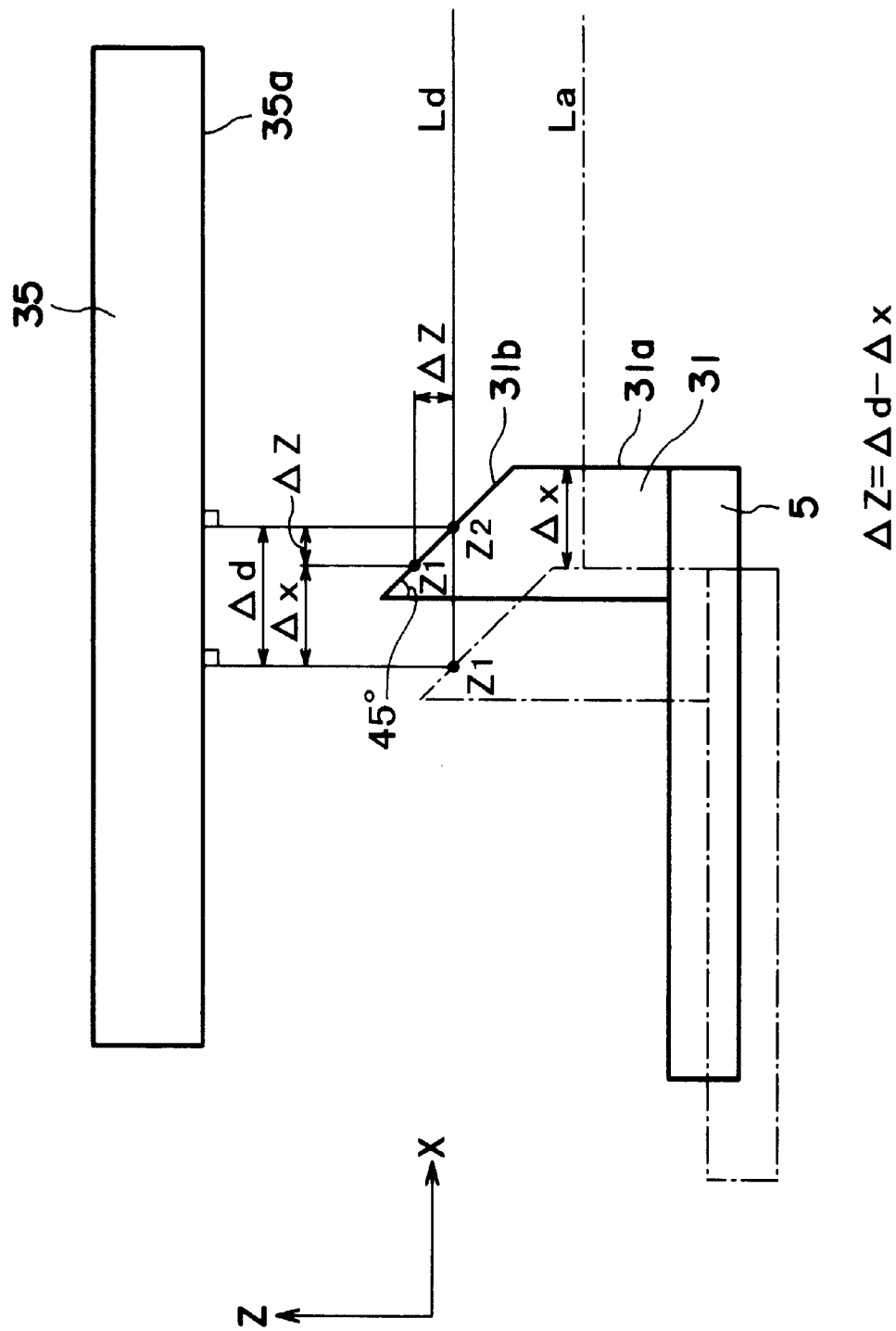
FIG. 3 is a schematic view for explaining position measurement with respect to a Z direction, in the first embodiment.

FIG. 3 is a schematic view for explaining position measurement with respect to the Z direction.

In FIG. 3, laser light Ld projected from the laser interferometer 33d is deflected by the inclined reflection surface 31b, toward the Z direction. The laser light impinges on the reflection surface 35a of the fixed mirror 35, by which it is reflected just backwardly. Where Δd is a change in detected value of the laser interferometer 33d as the laser light Ld upon the reflection surface 31b shifts from its initial incidence point Z1 to a current incidence point Z2 and where Δx is a change in detected value of the laser interferometer 32a, in that case, as seen from the illustration of FIG. 3, a change Δz of detected value with respect to the Z direction can be determined simply as follows:

$$\Delta z = \Delta d - \Delta x.$$

The movement data for the top stage for accurately positioning a wafer (not shown) at an exposure station, as the wafer has been correctly placed on the wafer chuck 4, has been memorized in the control box 30. On the basis of the thus memorized data and of the detected current position data of the top stage 5, the control box 30 operates to move the top stage to place the same exactly at a predetermined position.

Figure 4:
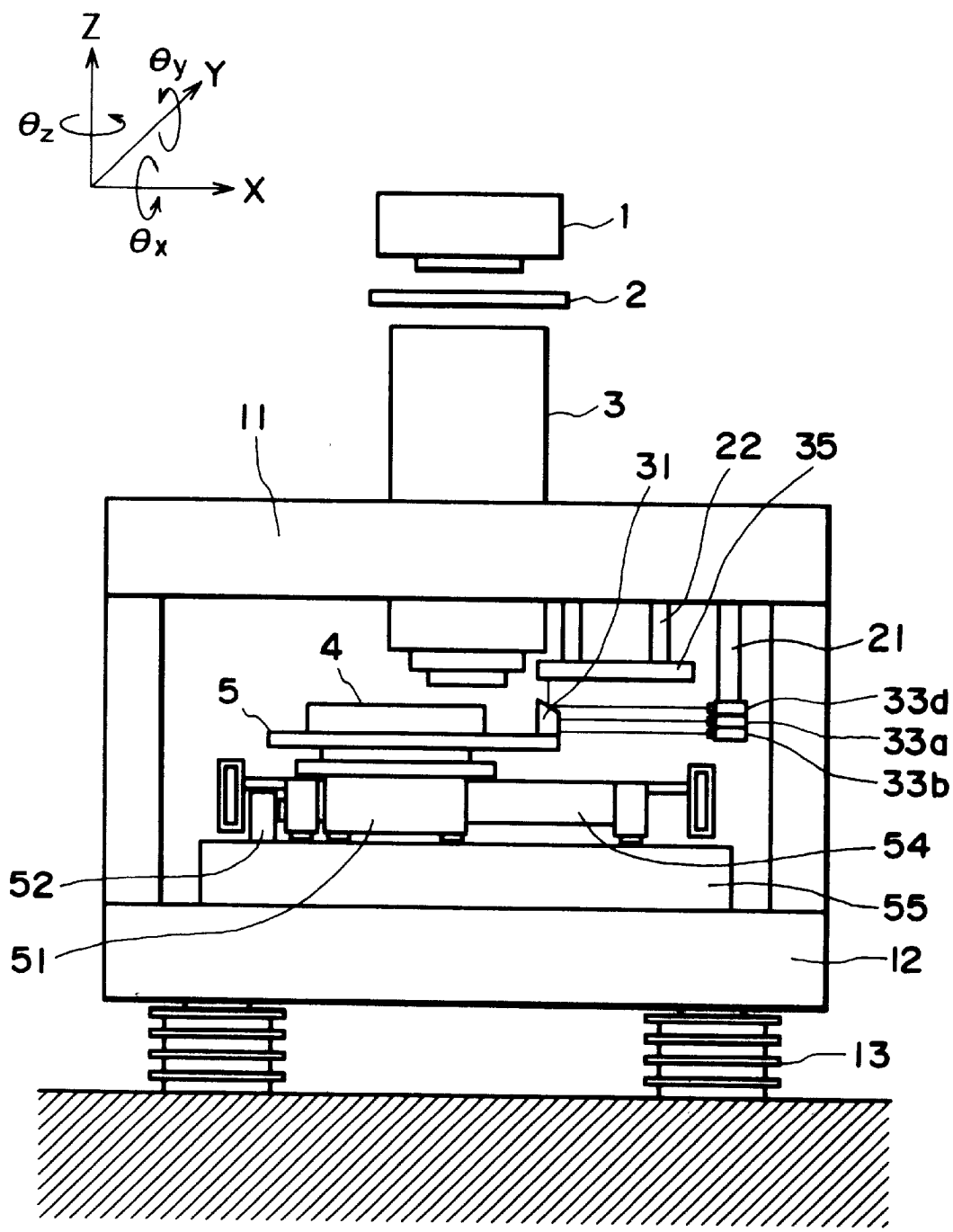
FIG. 4 is a front view of an exposure apparatus having a measuring system according to the first embodiment.

FIG. 4 is a front view of a semiconductor exposure apparatus having a stage system such as described above.

Denoted in the drawing at 2 is a reticle having a pattern to be transferred. Denoted at 1 is an illumination system for illuminating the reticle 2, and denoted at 3 is a projection optical system for projecting a pattern of the reticle 2 onto a wafer 3. Denoted at 11 is a barrel supporting structure for supporting the projection optical system. Exposure light to be projected is parallel to the Z-axis direction.

Denoted at 21 is a mounting member for fixedly mounting the interferometers 33a, 33b and 33c to the barrel supporting structure 11. The remaining interferometers, not shown in this drawing, are similarly fixedly supported by the barrel supporting structure.

Denoted at 22 is a mounting member for fixedly mounting the fixed mirror 35 to the barrel supporting structure 11. Denoted at 5 is a top stage which can be moved by guide means (such as a static pressure guide) and driving means (such as linear motors) relative to the X stage 51, along the Z direction and θx, θy and θz directions. Denoted at 55 is a stage base for supporting the X stage 51 and a Y stage 54, without contact thereto, with respect to the Z direction and through static bearing means. Denoted at 12 is a base table on which the stage base 55 is placed. With this base table 12, the stage base 55 and the barrel supporting structure 11 are combined substantially integrally with each other. Denoted at 13 is an air mount mechanism (vibration isolating mechanism) having components disposed at three or four locations, for supporting the barrel supporting structure 11 and the base table 12. The air mount mechanism 13 serves to insulate vibration to be transmitted from the floor to the base table 12 and the barrel supporting structure 11.

In FIG. 4, the barrel supporting structure 11 provides a reference structure for alignment between the reticle 2 and the wafer (not shown) placed on the wafer chuck 4.

As a feature of this embodiment, since the position and posture of the top stage 5 with respect to six axial directions can be detected by laser interferometers mounted on the barrel supporting structure 11, even if the X stage 51 or the Y stage 54 moves through a long stroke, there is a small measurement error due to the influence of the surface precision of the guide for the stage base 55 or to deformation of the base table 12. Thus, high precision alignment between the reticle 2 and the wafer (not shown) placed on the wafer chuck 4 is accomplished.

Figure 5:
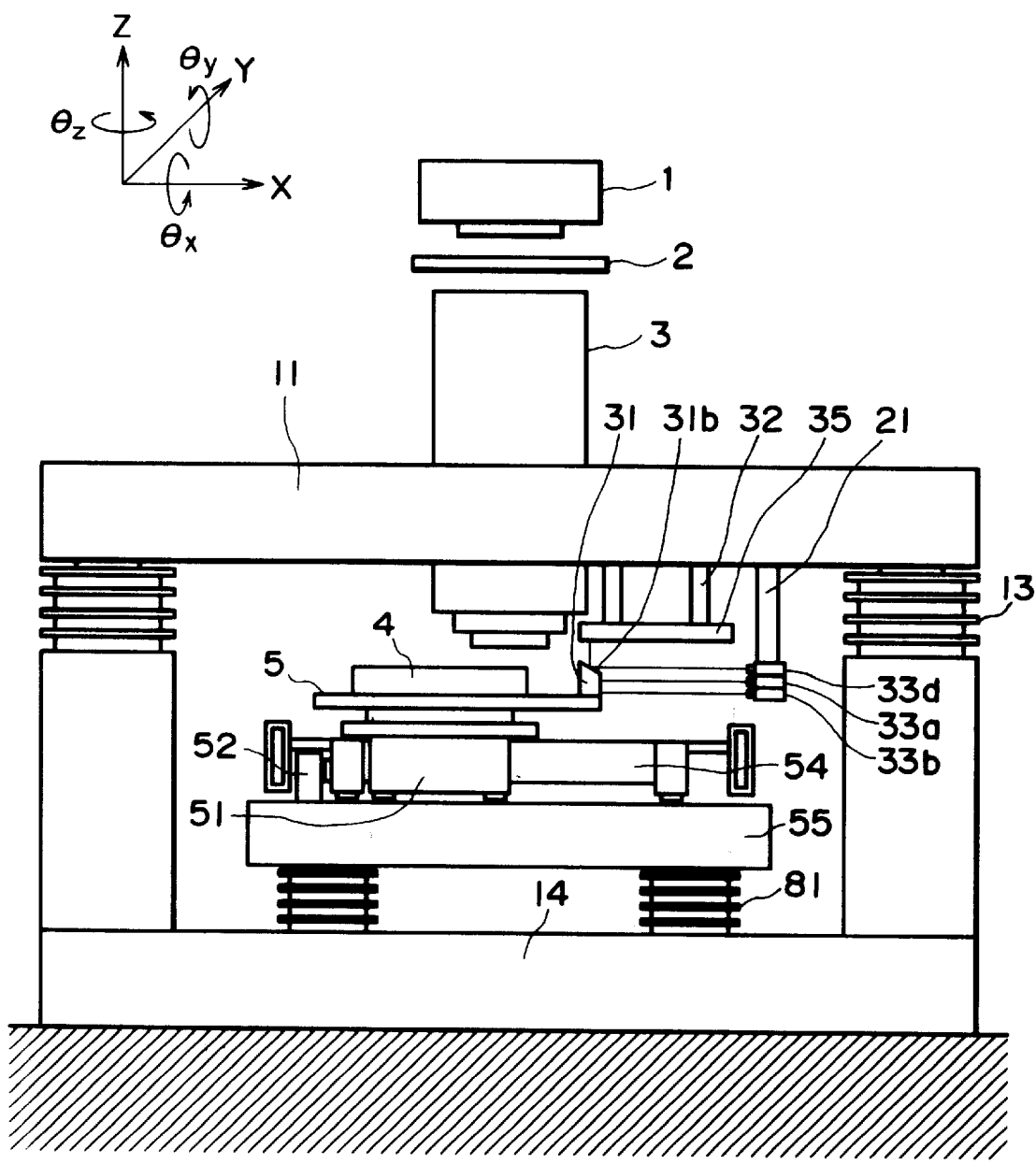
FIG. 5 is a front view of another exposure apparatus having a measuring system according to the first embodiment.

Another form of a semiconductor exposure apparatus such as shown in FIG. 5 may be provided. In FIG. 5, like numerals are assigned to components corresponding to those of the semiconductor exposure apparatus described above. A duplicate description will be omitted.

Denoted at 81 is an air mount mechanism having components disposed at three or more locations, for supporting the stage base 55. Denoted at 14 is a base table for supporting the barrel supporting structure 11 through an air mount mechanism 13 and also for supporting the stage base 55 through the air mount mechanism 81.

In the structure of the exposure apparatus in this form of the present invention, like that of the preceding embodiment, the fixed mirror 35 has a length (dimension in the X-axis direction) corresponding to the movement amount of the top stage 5 in the X-axis direction, and it is fixedly mounted on the barrel supporting structure 11 so that its reflection mirror surface acts in the negative Z direction. The fixed mirror 35 functions to reflect the laser light, projected from the laser interferometer 33d and reflected by the inclined reflection surface 31d of the mirror 31 mounted on the top stage 5, backwardly along the beam incidence direction (Z-axis direction).

The position and posture of the top stage 5 with respect to the X, Y, Z, θx, θy and θz directions can be detected by means of laser interferometers mounted on the barrel supporting structure 11.

As a feature of this exposure apparatus, since any deformation of the stage base 55 due to movement load or stage inertia produced during movement acceleration or deceleration is not transmitted to the barrel supporting structure 11 even though the X stage 51 or Y stage 54 moves through a long stroke, the position or posture of the top stage 5 can be detected without being influenced by a measurement error resulting from the above. Therefore, high precision alignment between the reticle 2 and a wafer (not shown) placed on the wafer chuck is accomplished.

In accordance with this embodiment of the present invention, in a simple structure, the laser beams parallel to the X-Y plane are projected to the reflection surface 31b being inclined by 45 deg. with respect to the X-Y plane, by which the position of the stage in the Z direction can be measured. Further, in this embodiment, while using the supporting structure for supporting the interferometers as a reference, the position and posture of the top stage with respect to six axial directions can be measured directly. As a result of this, there is no necessity of using plural sensors disposed in series. Additionally, the position measurement to the top stage with respect to the Z direction can be made directly without use of a relative sensor for detecting a displacement between the X stage and the top stage. This effectively reduces position measurement error in the Z direction.

Laser light to be projected on a mirror for stage position measurement comprises laser lights parallel to the X-Y plane. As a result, the structure of the position measuring system with a laser interferometer can be simplified.

When a positioning system having such a measuring system is incorporated into a semiconductor exposure apparatus, the position or posture of a wafer can be measured very precisely. This ensures high precision exposure. Further, simplification of the stage measuring system accomplishes a reduction in size and weight of the exposure apparatus as well as a reduction in cost of the same.

Use of the measuring system described above is not limited to a wafer stage system. It can be applied to a reticle stage system. Moreover, the measuring system with an inclined reflection surface may be applied to any positioning system for accurately positioning a movable element, with substantially the same advantageous results.

Embodiment 2

Figure 6:
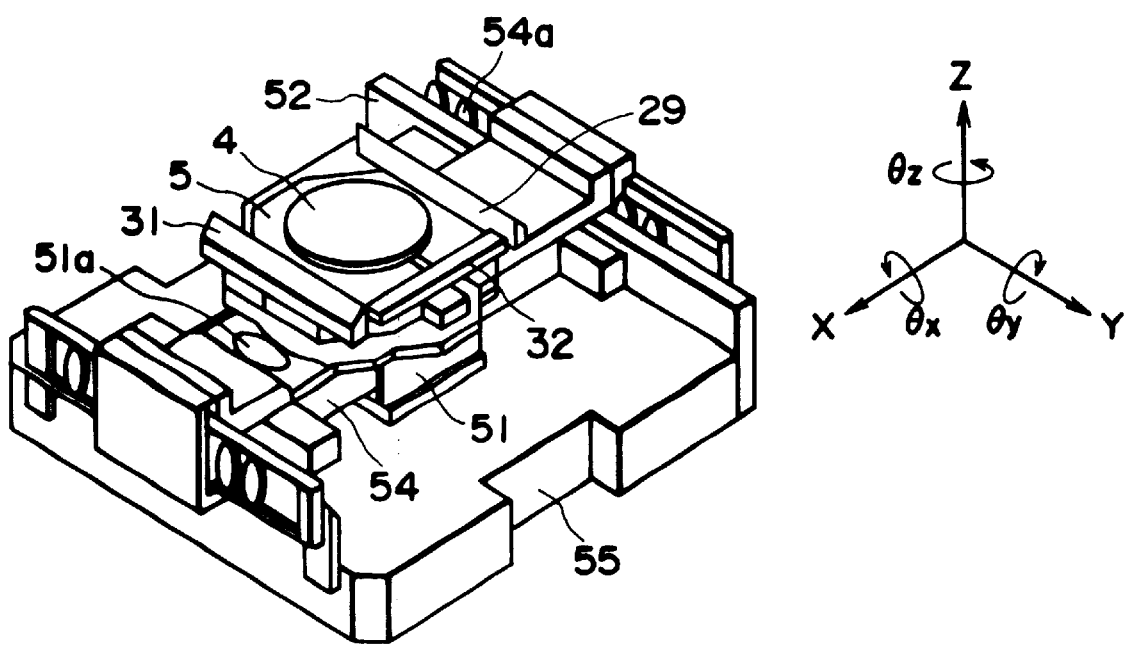
FIG. 6 is a perspective view of a wafer stage according to a second embodiment of the present invention.

FIG. 6 is a perspective view of a wafer stage according to a second embodiment of the present invention.

In FIG. 6, components corresponding to those of the preceding embodiment are denoted by the same reference numerals, and a description therefor will be omitted here. In this embodiment, as compared with the preceding embodiment, there is an auxiliary mirror 29 disposed opposed to the X mirror with respect to the X direction.

Figure 7:
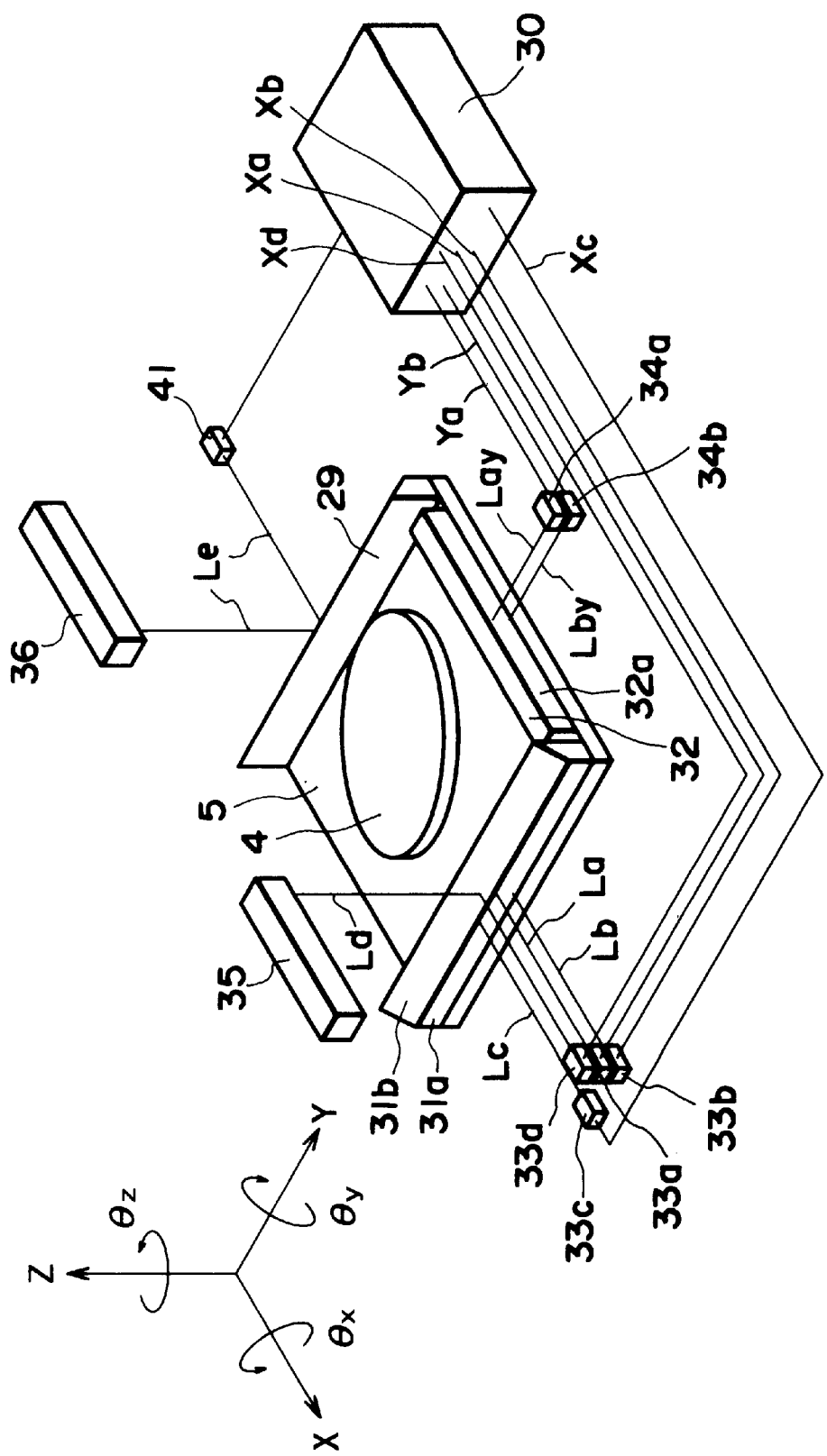
FIG. 7 is a perspective view of a measuring system according to the second embodiment.

FIG. 7 is a perspective view for explaining a measuring system with laser interferometers, constituting a major portion of this embodiment.

Denoted in FIG. 7 at 30 is a control box having a computing circuit, a driving circuit and so on accommodated therein. Denoted at La, Lb, Lc, Ld, Lay, and Lby are laser lights. Denoted at 31 is an X mirror being mounted on the top stage 5 and having an integral structure of mirrors with reflection surfaces 31a and 31b. The reflection surface 31a comprises an optical element disposed perpendicularly to the X-axis direction. The reflection surface 31b comprises an optical element disposed with a tilt of 45 deg. in the θy direction, with respect to the X-Y plane. Denoted at 29 is an auxiliary mirror mounted on the top stage 5 and having a reflection surface 29b. The reflection surface 29b comprises an optical element disposed with a tilt of 45 deg. in the θy direction with respect to the X-Y plane. Denoted at 32 is a Y mirror mounted on the top stage 5, and it has a reflection surface 32a disposed perpendicularly to the Y-axis direction.

Denoted at 32a, 32b, and 33c are interferometers for measurement with respect to the X direction. These interferometers function to project laser lights La, Lb and Lc, each being parallel to the X direction, upon predetermined locations on the reflection surface 31a, and, positional change information about the top stage 5 with respect to the beam incidence direction (X-axis direction) can be detected on the basis of reflected lights from the surface 31a. Denoted at 34a and 34b are interferometers for measurement with respect to the Y direction. They serve to project laser lights, each being parallel to the Y direction, upon predetermined locations on the reflection surface 32a, and, positional change information of the top stage 5 with respect to the beam incidence direction (Y-axis direction) can be detected on the basis of reflected lights from the surface 32a.

Denoted at 33d is an interferometer disposed in alignment with the interferometer 33a with respect to the Z-axis direction. It projects laser light Ld to the reflection surface 31b along the X-axis direction. Denoted at 41 is an interferometer disposed opposed to the interferometer 33d, and it projects laser light Le onto a predetermined location on the reflection surface 31b along the X-axis direction.

The laser lights impinging on the reflection surfaces 31b and 29b are substantially parallel to the X-axis direction, and they advance in opposite directions.

These interferometers 32a, 32b, 33c, 33d, 34a, 34b and 41 are fixedly supported by a support structure (not shown) which provides a measurement reference. Denoted at 35 is a first fixed mirror having a reflection mirror surface facing in a negative Z direction, for deflecting (reflecting) laser light, coming from the interferometer 33d and being deflected by the reflection surface 31b, backwardly along its beam incidence direction (Z-axis direction). The first fixed mirror 35 has a length corresponding to about a half of the movement amount of the top stage 5 in the X-axis direction, and it is fixedly supported by the unshown support structure which provides a measurement reference. Denoted at 36 is a second fixed mirror having a reflection mirror surface facing in the negative Z direction, for deflecting (reflecting) laser light Le, coming from the interferometer 41 and being deflected by the reflection surface 29b, backwardly along its beam incidence direction (Z-axis direction). The second fixed mirror 36 has a length (dimension in the X-axis direction) corresponding to about a half of the movement amount of the top stage 5 in the X-axis direction, and it is fixedly supported by the unshown support structure which provides a measurement reference.

The positions of the mirrors 31, 32, and 29, that is, the initial position of the top stage 5 has been memorized in the control box 30. The current position of the top stage 5 can be obtained by adding, to this initial position, the integrated value of displacements of the mirrors 31 and 32 measured by laser interferometers. Position measurement to the stage in the X and Y directions can be performed by use of the laser interferometers 33a and 34a. Also, rotational amount measurement to the stage with respect to the θz direction can be performed by detecting any difference between detected values of the laser interferometers 33a and 33c and by processing it within the control box 30. Rotational amount measurement to the stage with respect to the θy direction can be performed by detecting any difference between detected values of the laser interferometers 33a and 33b and by processing it within the control box 30. Rotational amount measurement to the stage with respect to the θx direction can be performed by detecting any difference between detected values of the laser interferometers 34a and 34b and by processing it within the control box 30.

Position measurement to the stage with respect to the Z direction can be performed by detecting the detected values of the laser interferometers 33a and 33d or of the laser interferometers 41 and 33a and by processing it inside the control box 30. Details of this will be described later.

Figure 8:
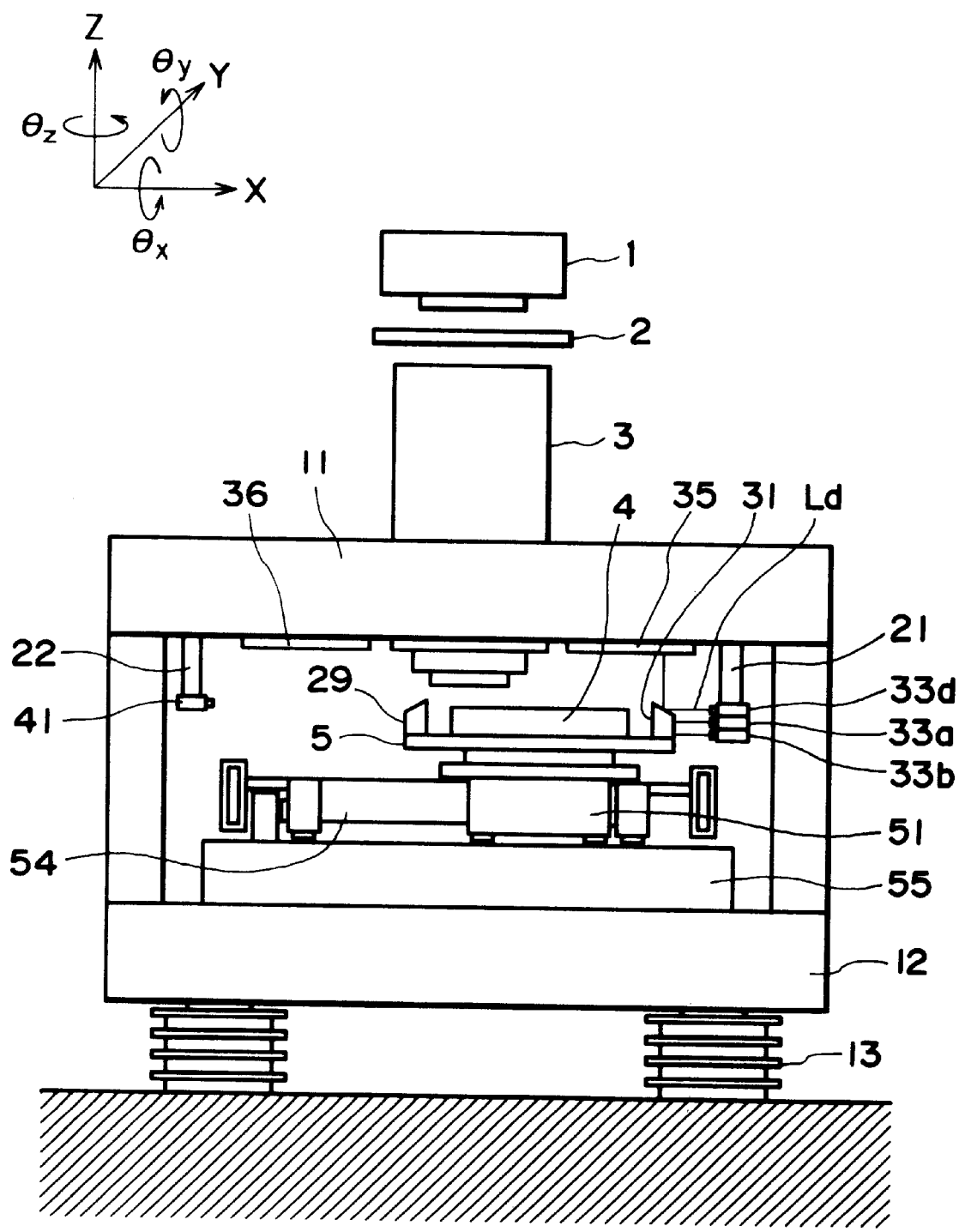
FIGS. 8 and 9 are front views, respectively, of an exposure apparatus having a measuring system according to the second embodiment.
Figure 9:
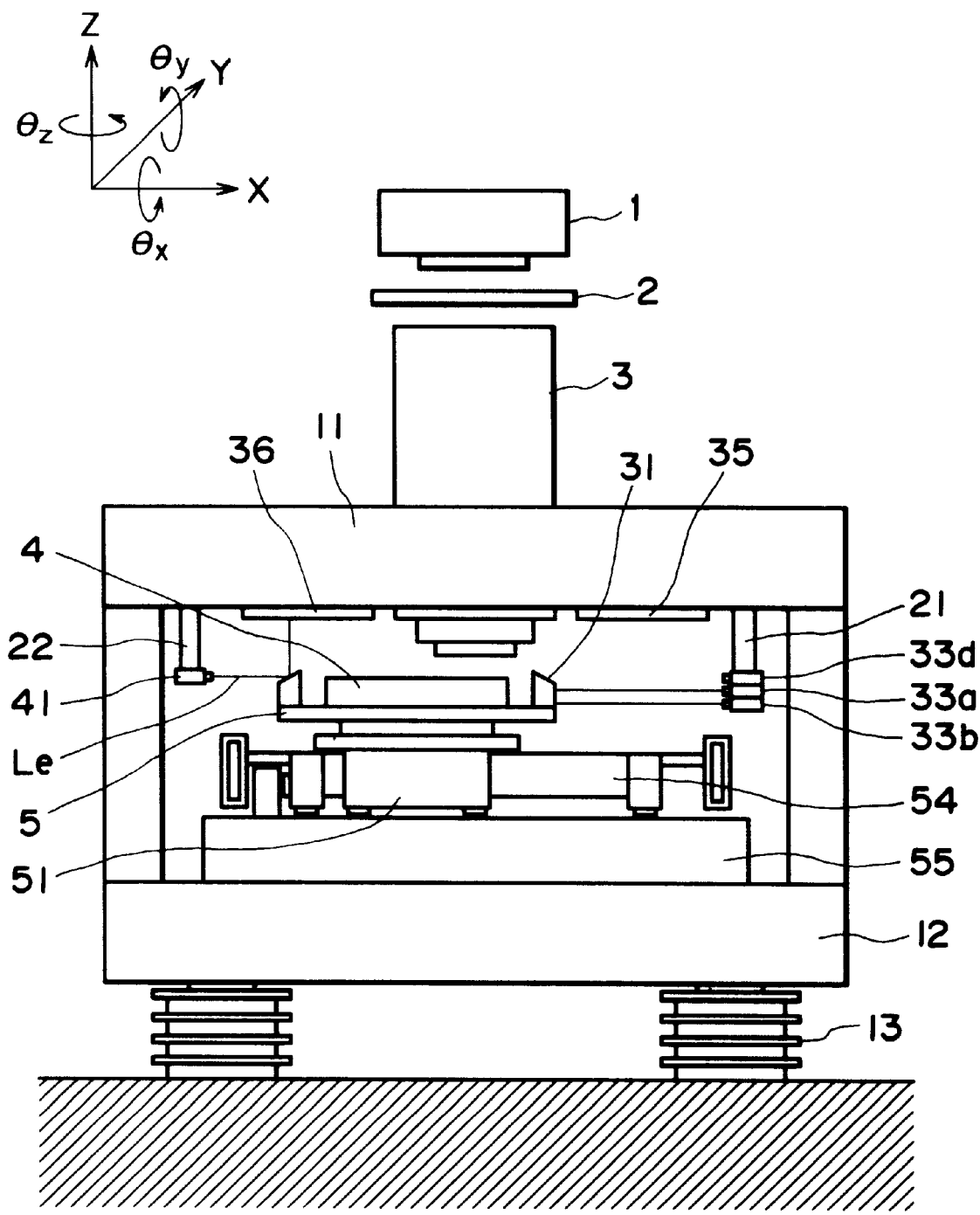

FIGS. 8 and 9 are front views, respectively, of a semiconductor exposure apparatus having a stage system according to this embodiment. Components corresponding to those of the exposure apparatus of the preceding embodiment are denoted by the same reference numerals, and a description therefor will be omitted here.

Denoted in these drawings at 21 is a mounting member for fixedly mounting the interferometers 32a, 33b and 33c to the barrel supporting structure 11. Denoted at 22 is a mounting member for fixedly mounting the interferometer 41 to the barrel supporting structure. The remaining interferometers, not shown in this drawing, are similarly fixedly supported by the barrel supporting structure. Also, the first and second fixed mirrors 35 and 36 are fixedly mounted on the barrel supporting structure.

In FIGS. 8 and 9, when the top stage 5 is placed on the positive X-axis direction side of the optical axis center of the projection optical system 3, the laser light Le from the laser interferometer 41 is blocked by a shutter (not shown). Here, position measurement with respect to the Z direction is performed by detecting and processing the detected values of the laser interferometers 33a and 33d.

Also, in FIGS. 8 and 9, when the top stage 5 is positioned about the optical axis center of the projection optical system 3, both of the laser interferometers 33d and 41 enable position measurement simultaneously. Here, on the basis of the positional information of the top stage 5, a measured value of one of the interferometers 33d and 41 is initialized and, after that, the laser light from the other interferometer is blocked. Thus, selective switching is made.

As a feature of this embodiment, in addition to the advantageous results of the preceding embodiment, the interchanging of laser interferometers in accordance with the position of the top stage enables a reduction in size of the mirror member to be mounted on the top stage. This enables a reduction in size of the top stage and, therefore, a decrease of an unstable positioning error factor due to thermal deformation of the top stage, for example. Further, since the weight of the top stage can be lightened, the natural vibration frequency of the stage can be made higher. This effectively improves the positioning control performance. As a result, high precision and high speed alignment between a reticle and a wafer (not shown) placed on the wafer chuck is accomplished.

Figure 10:
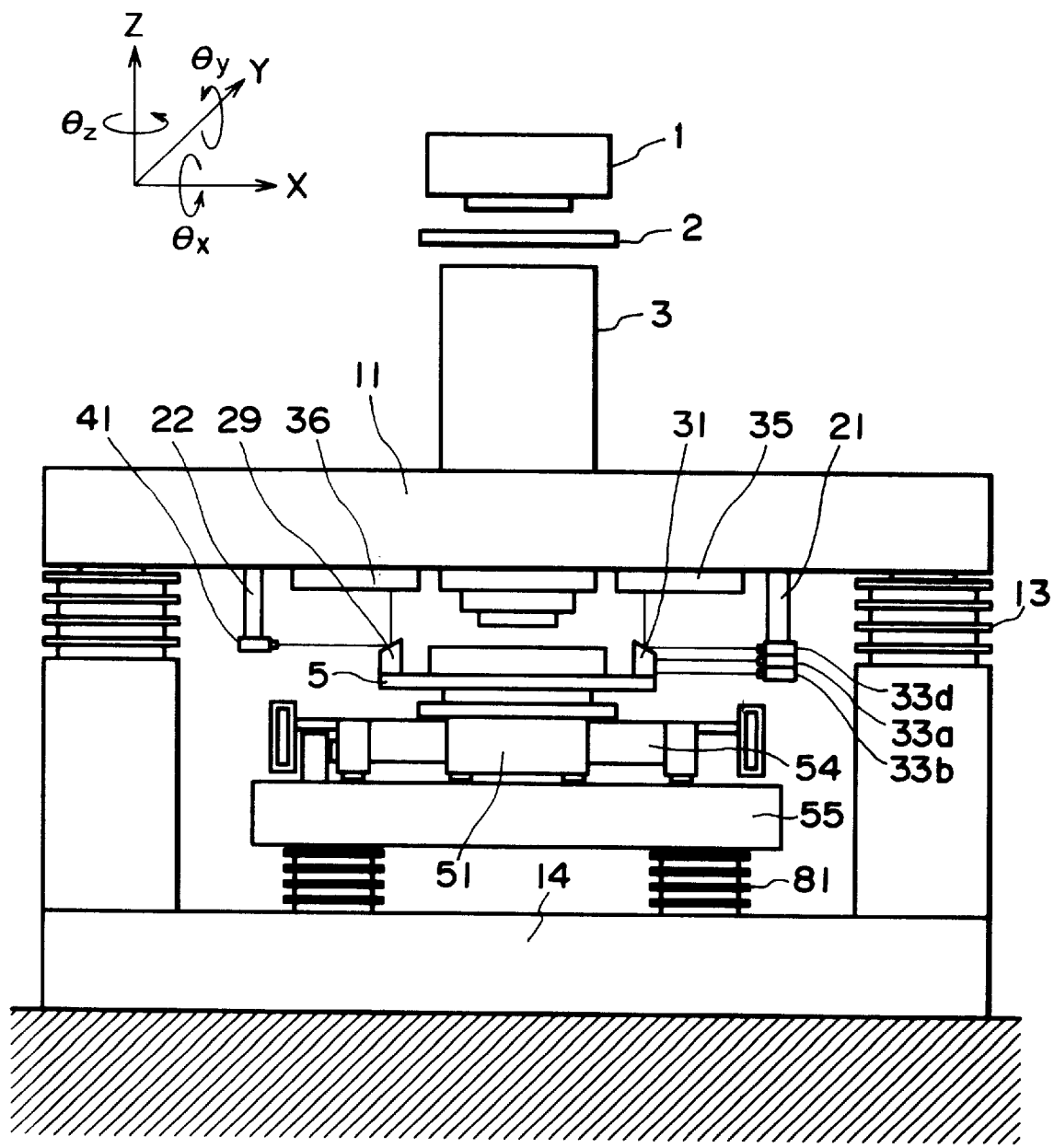
FIG. 10 is a front view of another exposure apparatus having a measuring system according to the second embodiment.

In the exposure apparatus shown in FIGS. 8 and 9, the stage base and the barrel supporting structure are combined integrally with each other, and both of the stage base and the barrel supporting structure are insulated against vibration from the floor, by means of the air mount mechanism. However, the stage base and the barrel supporting structure may be supported by separate air mount mechanisms, such as that in a semiconductor exposure apparatus shown in FIG. 10.

Embodiment 3

Figure 11:
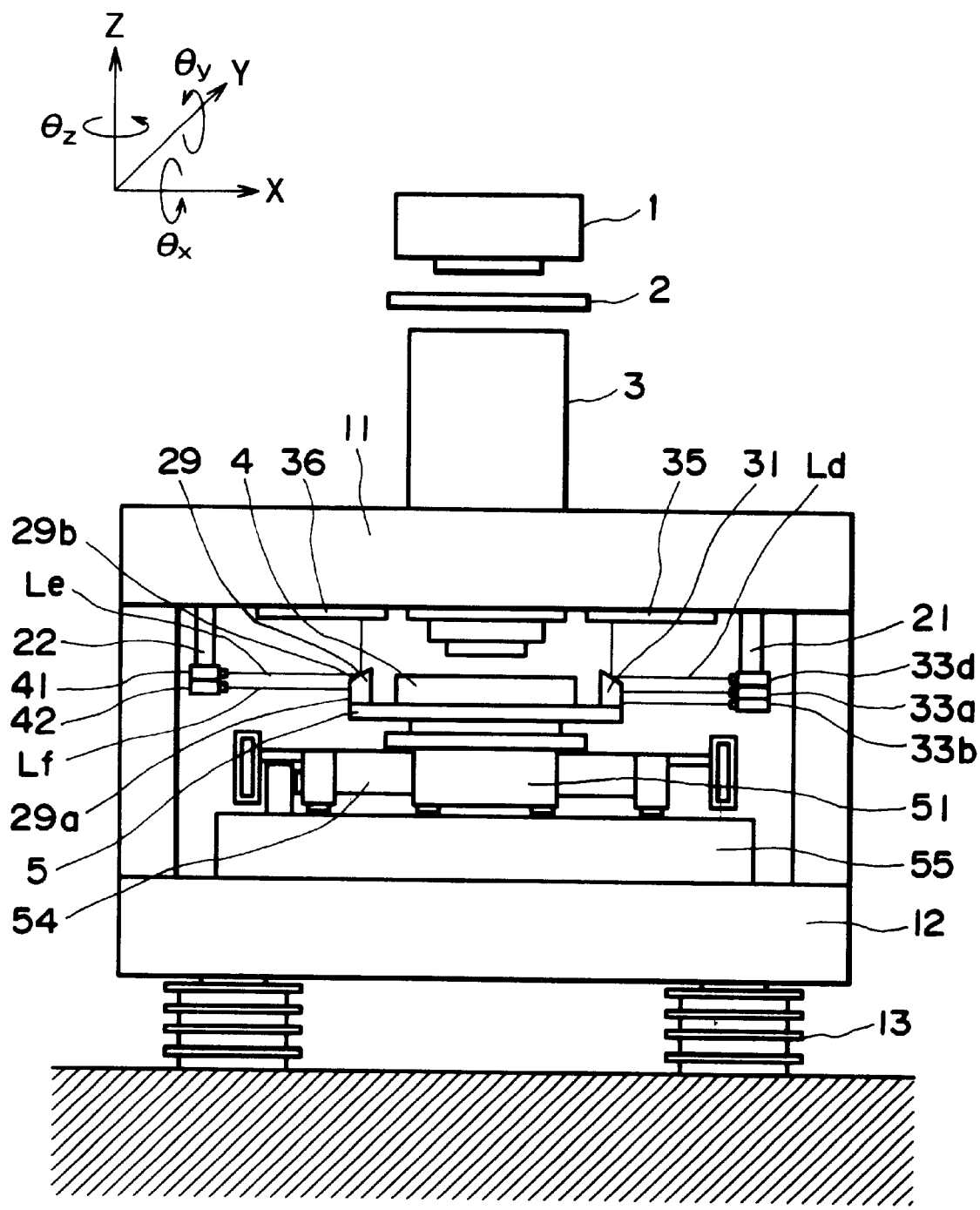
FIG. 11 is a front view of an exposure apparatus having a measuring system according to a third embodiment of the present invention.

FIG. 11 is a front view of a semiconductor exposure apparatus according to a third embodiment of the present invention.

In FIG. 11, components corresponding to those of the preceding embodiments are denoted by the same reference numerals.

Denoted in FIG. 11 at 29 is an auxiliary mirror mounted on the top stage 5. This auxiliary mirror 29 has two reflection surfaces, that is, a reflection surface 29a and an inclined reflection surface 29b. This differs from the preceding embodiment.

The reflection surface 29a is disposed perpendicularly to the X-axis direction, while the reflection surface 29b is disposed with a tilt by 45 deg. in the θy direction with respect to the X-Y plane. Denoted at 42 is an interferometer for measurement with respect to the X direction. It serves to project laser light Lf onto a predetermined location on the reflection surface 29a, and positional change information of the top stage 5 with respect to the beam incidence direction (X-axis direction) can be detected on the basis of reflection light from the surface 29a.

When in FIG. 11 the top stage 5 is placed on the positive X-axis direction side of the optical axis center of the projection optical system, the laser light Le from the laser interferometer 41 is blocked by a shutter (not shown). Here, position measurement to the top stage 5 with respect to the Z direction is performed by detecting and processing a difference between the detected values of the laser interferometers 33a and 33d. When the top stage 5 is positioned on the negative X-axis direction side of the optical axis center of the projection optical system, the laser light Ld from the laser interferometer 33d is blocked by a shutter (not shown). Here, position measurement to the top stage 5 with respect to the Z direction can be performed by detecting and processing a difference between the detected values of the laser interferometers 42 and 41. When the top stage 5 is positioned about the optical axis center of the projection optical system, both of the laser interferometers 33d and 41 enable position measurement simultaneously. When both of the laser interferometers 33d and 41 perform the position measurement to the top stage 5, on the basis of the positional information of the top stage 5, one of the interferometers 33d and 41 is initialized and, after that, the laser light from the other interferometer is blocked. Thus, selective switching is made.

This embodiment provides substantially the same advantageous effects as those of the preceding embodiment.

Embodiment 4

Figure 12:
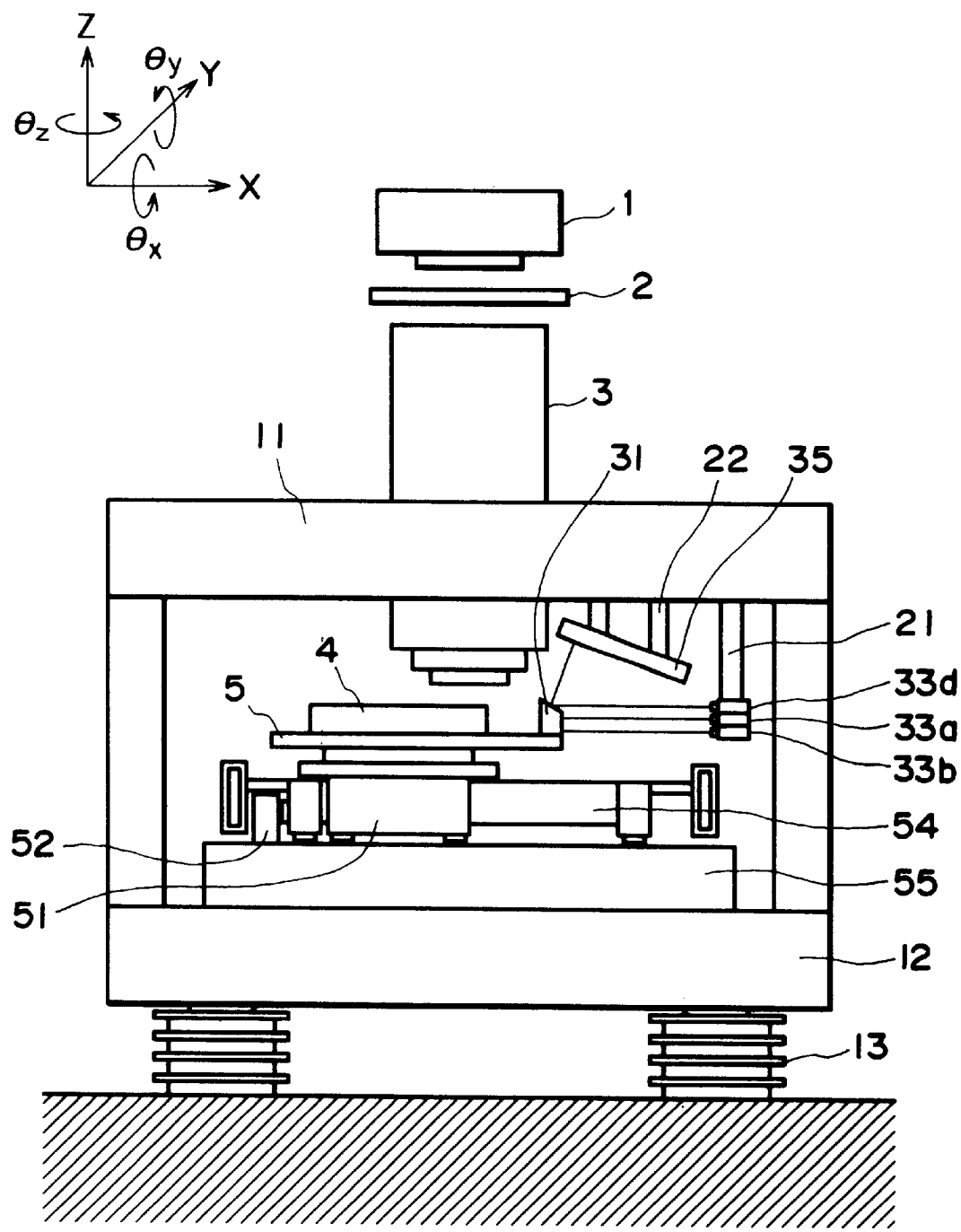
FIG. 12 is a front view of an exposure apparatus having a measuring system according to a fourth embodiment of the present invention.

FIG. 12 is a front view of a semiconductor exposure apparatus according to a fourth embodiment of the present invention.

In FIG. 12, components corresponding to those of the preceding embodiments are denoted by the same reference numerals, and a description thereof will be omitted here.

Denoted in the drawing at 31 is a mirror for reflecting, at an acute angle, the laser light projected thereto from the laser interferometer 33d. It is mounted on the top stage 5. Denoted at 35 is a mirror mounted with a predetermined angle on the barrel supporting structure, for deflecting the laser light reflected by the mirror 31, backwardly.

Figure 13:
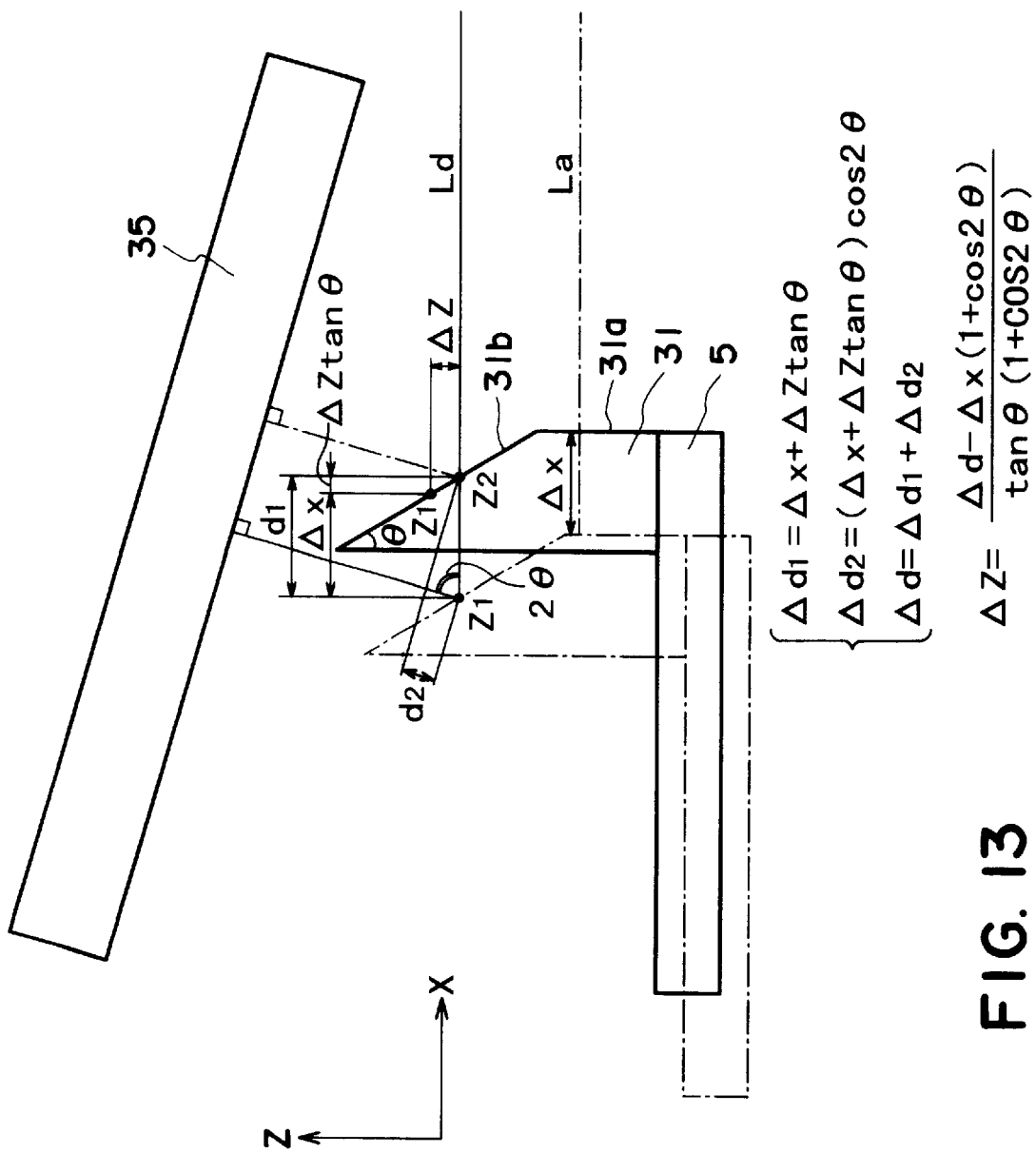
FIG. 13 is a schematic view for explaining position measurement with respect to a Z direction, in the fourth embodiment.

FIG. 13 is a schematic view for explaining details of position measurement in the Z direction.

The laser light Ld projected from the laser interferometer 33d is deflected by the reflection surface 31b at a predetermined angle so that it bears a positive Z direction component. The laser light is then projected on the reflection surface 35a of the fixed mirror 35, and it is reflected backwardly. Here, a change in detected value of the laser interferometer 33d as the laser light Ld shifts on the reflection surface 31b from its initial incidence point Z1 to a current incidence point Z2 is denoted by $\Delta d$, and a change in detected value of the laser interferometer 33a is denoted by $\Delta x$.

Here, as illustrated, a change $\Delta d_1$ of the laser light Ld in the X-axis direction and a change $\Delta d_2$ in the direction of reflection can be determined in accordance with the following equations:

$$\Delta d_1 = \Delta x + \Delta z \tan \theta$$

$$\Delta d_2 = (\Delta x + \Delta z \tan \theta) \cos 2\theta.$$

Thus, a change $\Delta z$ of detected value in the Z direction can be determined, by using the change $\Delta d$ of detected value of the laser interferometer 33d, in accordance with the following equation:

$$\Delta z = [\Delta d - \Delta x (1 + \cos 2\theta)] / [\tan \theta (1 + \cos 2\theta)].$$

The exposure apparatus of the above-described structure provides substantially the same advantageous effects as those of the preceding embodiment. Additionally, since the mirror is inclined so that an acute angle is defined between projected light and reflected light, the fixed mirror can be mounted on the barrel supporting structure 11 so as to avoid mechanical interference with the projection optical system.

This enables a reduction in size of the top stage 5 with respect to the X direction.

As a feature of this embodiment, since the size of the top stage can be made smaller, an unstable positioning error factor due to thermal deformation of the top stage, for example, can be reduced. Further, because of a reduction in weight of the top stage, the natural vibration frequency of the stage can be made higher. This effectively improves the positioning control performance. As a result, high precision and high speed alignment between a reticle 2 and a wafer (not shown) placed on the wafer chuck 4 is accomplished.

While this embodiment uses a mirror having an inclined reflection surface, being inclined with respect to the reference plane, the optical element is not limited to this. For example, a reflection type or transmission type diffraction grating may be used for deflection of inputted light. Such a diffraction grating may be one wherein a large number of slits are formed in a direction parallel to the reference plane. The grating surface may be perpendicular to or inclined to the reference plane. When measurement light impinges on the grating surface in a direction substantially parallel to the reference plane, higher order diffraction light is produced in the Z direction. By using such higher order diffraction light (e.g., first order light), the position of the stage in the Z direction can be measured. When a diffraction grating having its grating surface disposed perpendicularly to the incidence measurement beam, only a shift of the stage in the Z direction does not cause a change in length of an optical path of the measurement light. However, when the diffraction grating shifts in the Z direction, it causes a change in phase of first-order diffraction light. Thus, by measuring the phase change through an interferometer, a shift of the stage in the Z-axis direction can be measured.

Further, while this embodiment uses a mirror for reflecting the measurement beam at an acute angle, this is not a requisition. The reflection may be made with an obtuse angle.

Namely, an essential feature of this embodiment is that the measurement beam is deflected by an optical element so that it bears a Z-axis direction component. Provided that the light deflected by the optical member has a component in the Z-axis direction, the position of the stage in the Z direction can be detected.

Embodiment 5

Figure 14:
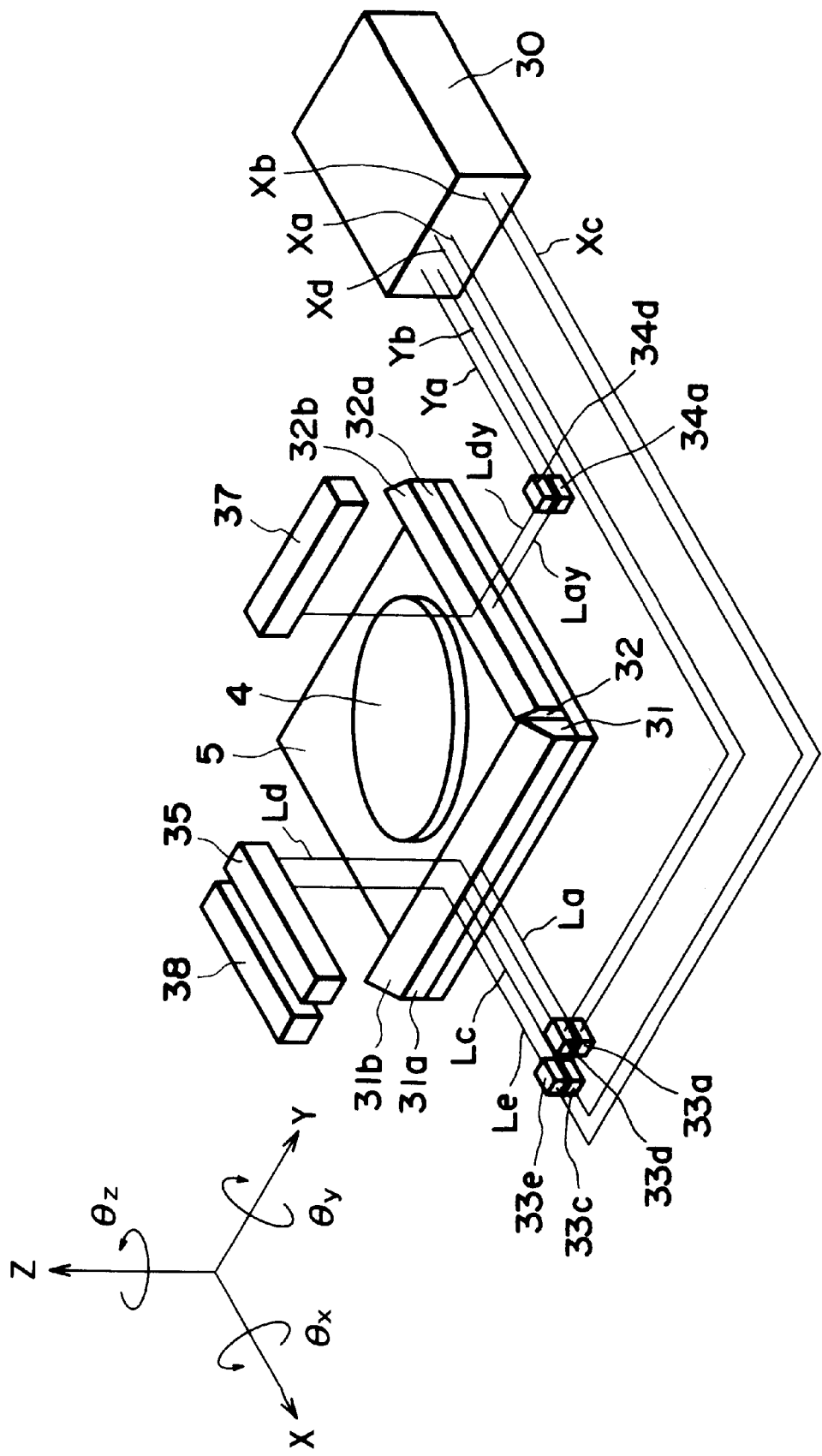
FIG. 14 is a perspective view of a measuring system according to a fifth embodiment of the present invention.

FIG. 14 is a perspective view of a measuring system with a laser interferometer, which constitutes a major portion of this embodiment.

In FIG. 14, components corresponding to those of the preceding embodiments are denoted by the same reference numerals, and a description thereof will be omitted here.

Denoted at 30 is a control box having a computer circuit, a driving circuit and so on accommodated therein. Denoted at La, Lb, Lc, Ld, Lay, and Lby are laser lights for position measurement. Denoted at 31 is an X mirror being mounted on the top stage and having an integral structure of mirrors with reflection surfaces 31a and 31b. The reflection surface 31a comprises an optical element disposed perpendicularly to the X-axis direction. The reflection surface 31b comprises an optical element disposed with a tilt of 45 deg. in the θy direction, with respect to the X-Y plane. Denoted at 32 is a Y mirror mounted on the top stage 5, and it has an integral structure of mirrors with reflection surfaces 32a and 32b. The reflection surface 32a comprises an optical element disposed perpendicularly to the Y-axis direction, while the reflection surface 32b comprises an optical element disposed with a tilt by 45 deg. in the θx direction with respect to the X-Y plane.

Denoted at 33a and 33c are interferometers for measurement with respect to the X direction. These interferometers function to project laser lights upon predetermined locations on the reflection surface 31a, and, positional change information about the top stage 5 with respect to the beam incidence direction (X-axis direction) can be detected on the basis of reflected lights from the surface 31a. Denoted at 34a is an interferometer for measurement with respect to the direction. It serves to project laser light to predetermined locations on the reflection surface 32a, and, positional change information of the top stage 5 with respect to the beam incidence direction (Y-axis direction) can be detected on the basis of reflected lights from the surface 32a.

Denoted at 33d is an interferometer disposed in alignment with the interferometer 33a with respect to the Z-axis direction. It projects laser light Ld, which is above or below the laser light La from the interferometer 33a and is parallel thereto, onto a predetermined location on the reflection surface 31b along the X-axis direction. Denoted at 33e is an interferometer disposed in line with the interferometer 33c with respect to the Z direction. It projects laser light Le, which is above or below the laser light Lc from the interferometer 33c and is parallel thereto, onto a predetermined location on the reflection surface 31b along the X-axis direction. Denoted at 34d is an interferometer disposed in line with the interferometer 34a with respect to the Z direction. It projects laser light Lby, which is above or below the laser light Lay from the interferometer 34a and is parallel thereto, onto a predetermined location on the reflection surface 32b along the X-axis direction.

Denoted at 35 and 38 are first and second fixed mirrors for reflecting the laser lights, projected from the interferometers 33d and 33e and reflected by the reflection surface 31b, backwardly along their beam incidence directions (Z-axis direction). Each of these mirrors has a reflection mirror surface facing in the negative Z direction, and has a length corresponding to the movement amount of the top stage 5 in the X-axis direction. These mirrors are fixedly mounted on a supporting structure, not shown, which provides a reference for measurement.

Denoted at 37 is a third fixed mirror for reflecting the laser light projected from the interferometer 34d and reflected by the reflection surface 32b backwardly along its beam incidence direction (Z-axis direction). It has a reflection mirror surface facing in the negative Z direction, and has a length corresponding to the movement amount of the top stage 5 in the Y-axis direction. It is fixedly mounted on the supporting structure (not shown) which provides a measurement reference.

The positions of the mirrors 31 and 32, that is, the initial position of the top stage 5 has been memorized in the control box 30. The current position of the top stage 5 can be obtained by adding, to this initial position, the integrated value of displacements of the mirrors 31 and 32 measured by laser interferometers. Position measurement to the stage in the X and Y directions can be performed by use of the laser interferometers 33a and 34a. Also, rotational amount measurement to the stage with respect to the θz direction can be performed by detecting any difference between detected values of the laser interferometers 33a and 33c and by processing it within the control box 30. Rotational amount measurements to the stage with respect to the θx and θy directions can be performed on the basis of the detected values of the laser interferometers 33d, 33e and 34d, and by processing the result within the control box 30.

It is important in this embodiment that three laser lights are projected on the inclined reflection surface. This is because it enables detection of positional information in the Z direction at these locations, which in turn enables position measurement to the stage in the θx and θy directions. To this end, in this embodiment, a total of three laser lights are projected on two inclined reflection surfaces. However, the structure is not limited to this. For example, three inclined surfaces may be prepared and laser light may be projected to them.

In accordance with this embodiment, three laser lights parallel to the X-Y plane are projected on a reflection surface being inclined by 45 deg. with respect to the X-Y plane, by which position measurement to the stage with respect to the Z direction and rotational amount detection in the θx and θy directions are performed. This enables direct measurement by using the supporting structure for supporting the interferometers as a reference. As a result, there is no necessity of using plural sensors disposed in series. Further, since position measurement to the stage in the Z direction and rotational amount detection in the θx and θy directions can be done directly without use of a relative sensor for detecting relative displacement between the X stage and the top stage, measurement error can be reduced significantly.

Moreover, since detection of rotational amount of the stage in the θx and θy directions is performed by projecting three laser lights, parallel to the X-Y plane, to the reflection surfaces 31b and 32b being inclined by 45 deg. with respect to the X-Y plane, the widths in the Z direction of the reflection surface 31a perpendicular to the X direction and of the reflection surface 32a perpendicular to the Y direction, can be reduced. This enables lightening in weight of the mirror and enlargement of the natural vibration frequency of the stage. The positioning control performance can therefore be improved. Thus, high speed and high precision alignment of a wafer (not shown) placed on the wafer chuck is accomplished.

The stage system of this embodiment may be applied to a reticle stage of an exposure apparatus, with substantially the same advantageous results described above and with substantially the same advantageous effects as those of the exposure apparatus described hereinbefore.

Embodiment 6

Figure 15:
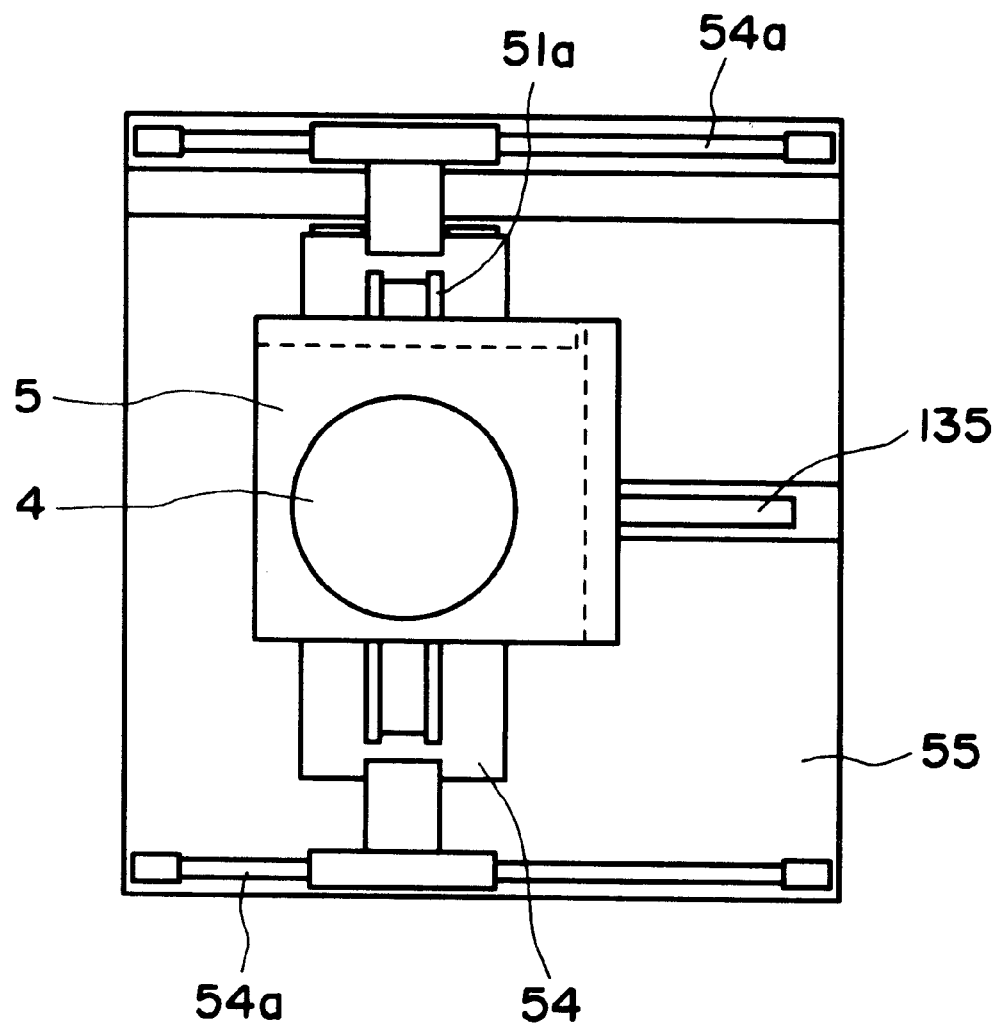
FIG. 15 is a top plan view of a wafer stage according to a sixth embodiment of the present invention.

FIG. 15 is a top plan view of a six-axis wafer stage according to a sixth embodiment of the present invention. In FIG. 15, components corresponding to those of the preceding embodiments are denoted by the same reference numerals.

This embodiment differs from the preceding embodiment in that laser light is reflected downwardly.

Denoted in FIG. 15 at 55 is a stage base (surface base table) having a reference plane (X-Y plane) on its top surface. Denoted at 54 is a Y stage which can be moved in the Y direction by a Y linear motor 54a while being guided in the Y direction by a Y guide. An X stage can be moved in the X direction by an X guide provided on the Y stage 54. Both of the X stage 51 and the Y stage 54 are supported out of contact to the reference plane of the base 55 through static bearing means (not shown).

Mounted on the X stage being movable in the X and Y direction is a four-axis operation (Z, θx, θy and θz) top stage which is a movable member. Denoted at 104 is a wafer chuck mounted on the top stage 105, for carrying thereon a wafer (not shown).

Denoted at 135 is a fixed mirror having a reflection mirror surface acting in the positive Z direction. The fixed mirror 135 has a length (dimension in the X-axis direction) corresponding to the movement amount of the top stage 2 in the X-axis direction, and it is fixedly mounted on the base table.

Figure 16:
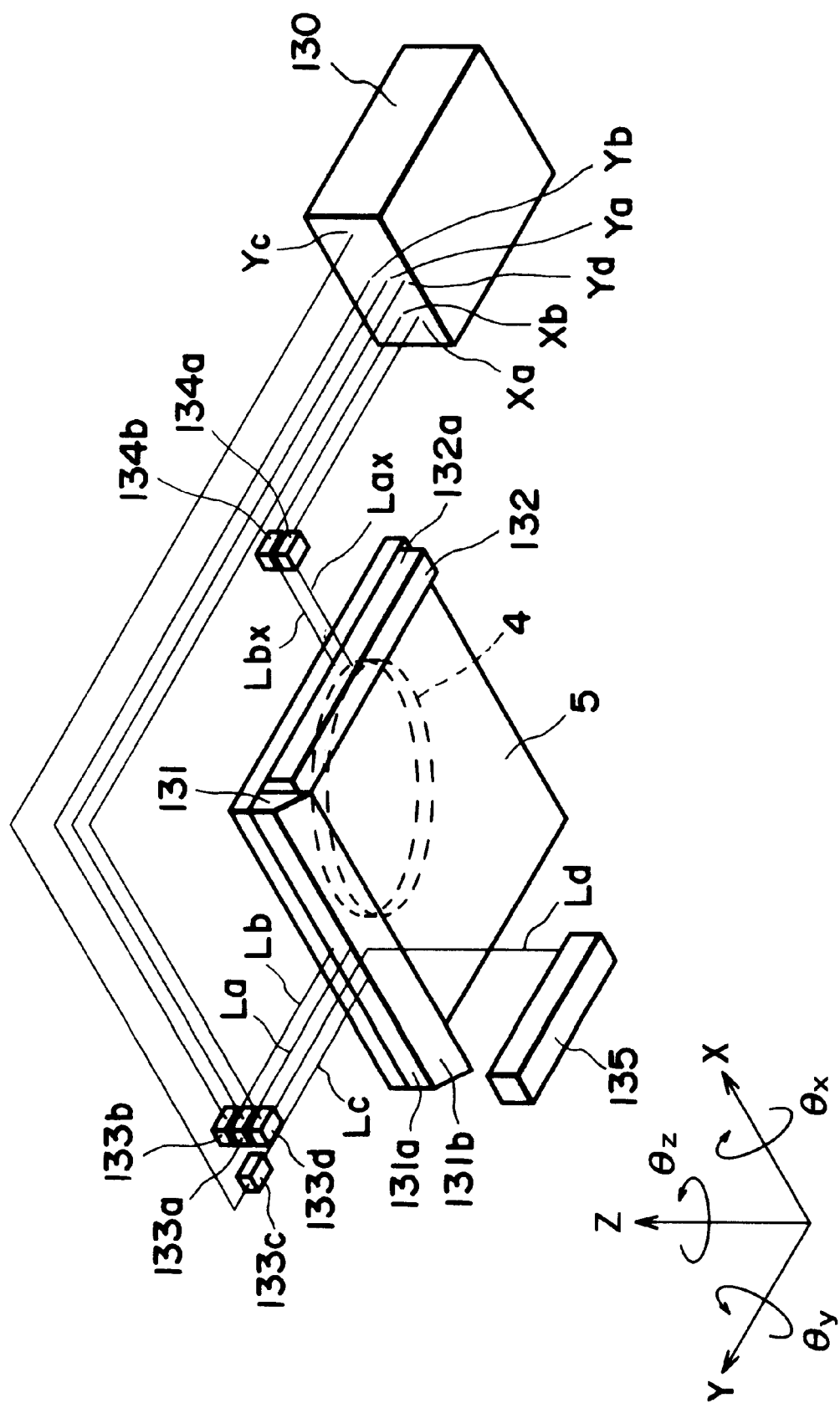
FIG. 16 is a perspective view of a measuring system according to the sixth embodiment.

FIG. 16 is a perspective view of a measuring system with a laser interferometer (position measuring means) which constitutes a major portion of this embodiment.

Denoted in the drawing at 4 is a wafer chuck for carrying a wafer (not shown) thereon. Denoted at 5 is a top stage supporting the wafer chuck 4 thereon. The top stage can be moved by guide and actuator means (not shown) in X-axis and Y-axis directions (first and second directions) with long strokes. Also, it can be moved in the Z-axis direction and in rotational directions θx, θy and θz with short strokes.

Denoted at 130 is a control box having a computing circuit, a driving circuit and so on accommodated therein.

Denoted at La, Lb, Lc, Ld, Lax, and Lbx are laser lights (measurement beams) for position measurement. Denoted at 131 is a Y mirror being mounted on the top stage 5 and having an integral structure of mirrors with reflection surfaces 131a and 131b. The reflection surface 131a comprises an optical element disposed perpendicularly to the Y-axis direction. The reflection surface 131b comprises an optical element disposed with a tilt of 45 deg. in the θy direction, with respect to the X-Y plane, and it provides an inclined reflection surface. Denoted at 132 is an X mirror mounted on the top stage 5, and it has a reflection surface 132a disposed perpendicularly to the X-axis direction.

Denoted at 133a, 132b, and 133c are interferometers (position measuring means) for measurement with respect to the Y direction. These interferometers function to project laser lights, each being parallel to the Y direction, upon predetermined locations on the reflection surface 131a, and, positional change information about the top stage 5 with respect to the beam incidence direction (Y-axis direction) can be detected on the basis of reflected lights from the surface 131a. Denoted at 134a and 134b are interferometers for measurement with respect to the X direction. They serve to project laser lights, each being parallel to the Y direction, upon predetermined locations on the reflection surface 132a, and, positional change information of the top stage 5 with respect to the beam incidence direction (X-axis direction) can be detected on the basis of reflected lights from the surface 132a.

Denoted at 133d is an interferometer disposed in alignment with the interferometer 133a with respect to the Z-axis direction. It projects laser light to the reflection surface 131b along the X-axis direction.

Elements 133a, 133b and 133d are interferometers for detecting laser lights La, Lb and Ld, positioned in line along the Z-axis direction and being parallel to each other. Elements 134a and 134b are interferometers for detecting laser lights Lax and Lbx, positioned in line along the Z-axis direction and being parallel to each other.

These interferometers 133a, 132b, 133c, 133d, 134a and 134b are fixedly supported by a support structure (not shown) which provides a measurement reference.

Denoted at 135 is a fixed mirror having a reflection mirror surface in the positive Z direction, for reflecting laser light, coming from the interferometer 133d and being deflected by the reflection surface 131b in the negative Z-axis direction, backwardly along its on-coming beam path. The fixed mirror 135 has a length (dimension in the X-axis direction) corresponding to the movement amount of the top stage 5 in the Y-axis direction, and it is fixedly supported by the base table 55.

The laser interferometer means described above functions to detect positional change information (amount and speed of shift, for example). It has a well-known structure and, therefore, a description of details of its structure will be omitted.

The positions of the mirrors 131 and 132, that is, the initial position of the top stage 5 has been memorized in the control box 30. The current position of the top stage 5 can be obtained by adding, to this initial position, the integrated value of displacements of the mirrors 131 and 132 measured by laser interferometers. Position measurement to the stage in the X and Y directions can be performed by use of the laser interferometers 133a and 134a. Also, rotational amount measurement to the stage with respect to the θz direction can be performed by detecting any difference between detected values of the laser interferometers 133a and 133c and by processing it within the control box 30. Rotational amount measurement to the stage with respect to the θx direction can be performed by detecting any difference between detected values of the laser interferometers 133a and 133b and by processing it within the control box 30. Rotational amount measurement to the stage with respect to the θy direction can be performed by detecting any difference between directed values of the laser interferometers 134a and 134b and by processing it within the control box 30.

Position measurement to the stage with respect to the Z direction can be performed by detecting any difference between detected values of the laser interferometers 133a (or 133b) and 133d and by processing it inside the control box 130. Details of this will be described below.

Figure 17:
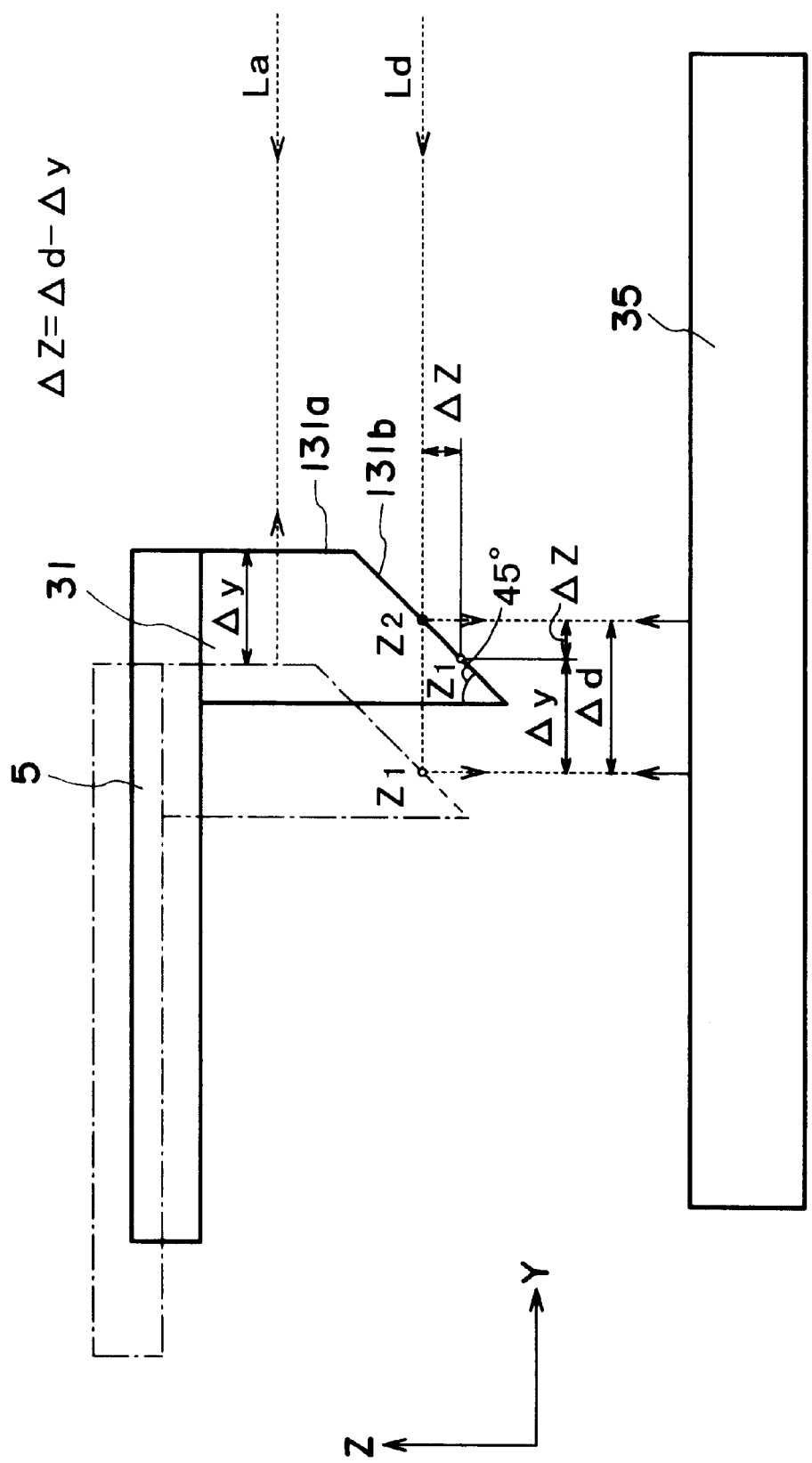
FIG. 17 is a schematic view for explaining position measurement with respect to a Z direction, in the sixth embodiment.

FIG. 17 is a schematic view for explaining position measurement with respect to the Z direction.

In FIG. 17, laser light Ld projected from the laser interferometer 133d is deflected by the inclined reflection surface 131b, toward the negative z direction. The laser light impinges on the reflection surface 135a of the fixed mirror 135, by which it is reflected just backwardly. Where Δd is a change in detected value of the laser interferometer 133d as the laser light Ld upon the reflection surface 131b shifts from its initial incidence point Z1 to a current incidence point Z2 and where Δx is a change in detected value of the laser interferometer 33a in that case, as seen from the illustration of FIG. 17, a change Δz of detected value with respect to the Z direction can be determined simply as follows:

$$\Delta z = \Delta d - \Delta y.$$

Comparing this with the case of the first embodiment, the sign of the change Δz in detected value with respect to the Z direction is reversed.

The movement data for the top stage for accurately positioning a wafer (not shown) at an exposure station, as the wafer has been correctly placed on the wafer chuck 4, has been memorized in the control box 130. On the basis of the thus memorized data and of the detected current position data of the top stage 5, the control box 30 operates to move the top stage to place the same exactly at a predetermined position.

Figure 18:
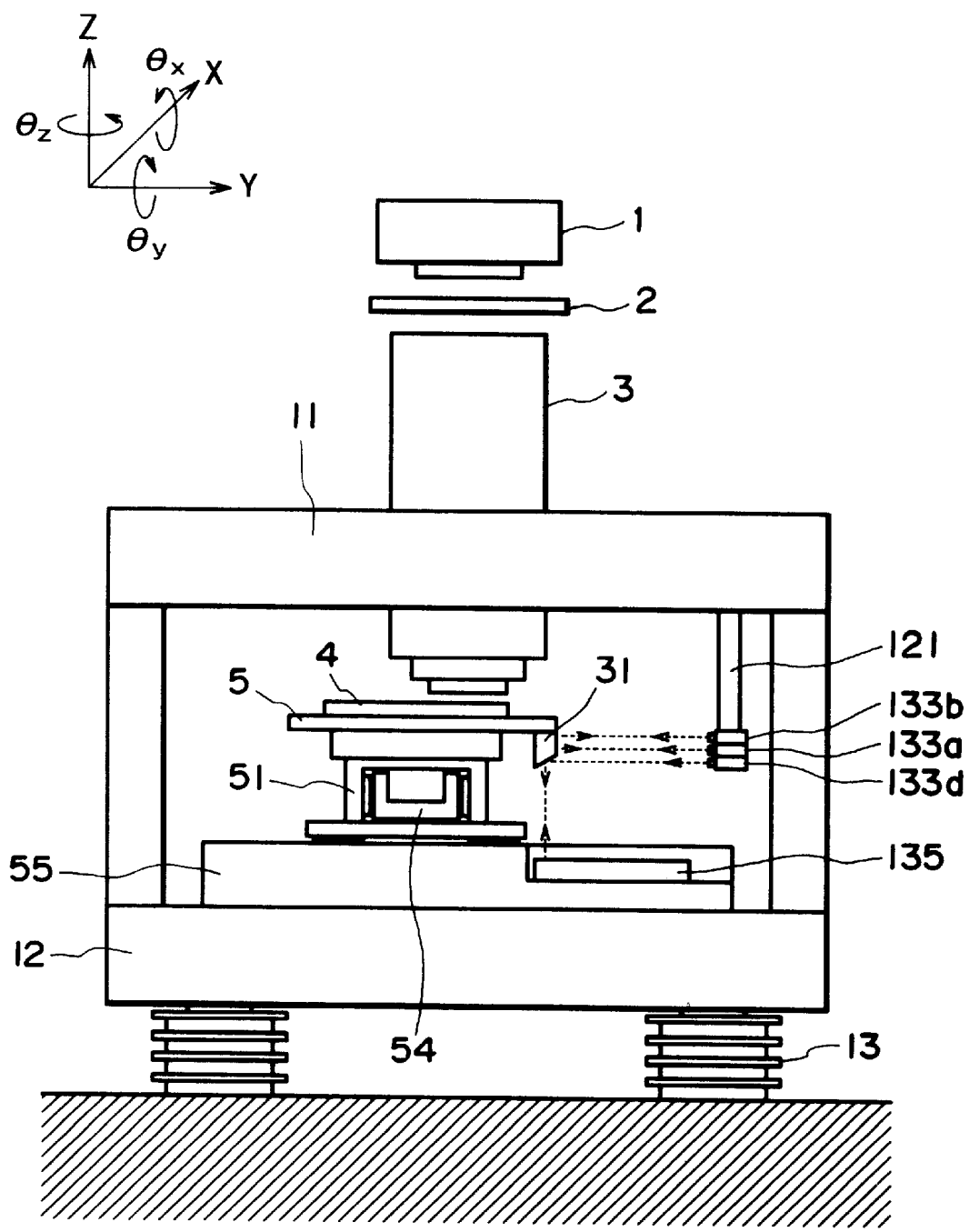
FIG. 18 is a front view of an exposure apparatus having a measuring system according to the sixth embodiment.

FIG. 18 is a front view of a semiconductor exposure apparatus having a stage system such as described above.

In FIG. 18, components corresponding to those of the preceding embodiments are denoted by the same reference numerals, and a description thereof will be omitted here.

Denoted at 121 is a mounting member for fixedly mounting the interferometers 133a, 133b and 133c to the barrel supporting structure 11. The remaining interferometers, not shown in this drawing, are similarly fixedly supported by the barrel supporting structure.

Denoted at 5 is a top stage which can be moved by guide means (such as a static pressure guide) and driving means (such as linear motors) relatively to an X stage 51, along the Z direction and θx, θy and θz directions. Denoted at 55 is a stage base for supporting the X stage 51 and a Y stage 54, without contact thereto, with respect to the Z direction and through static bearing means. Denoted at 12 is a base table on which the stage base 55 is placed. With this base table 12, the stage base 55 and the barrel supporting structure 11 are combined substantially integrally with each other. Denoted at 13 is an air mount mechanism (vibration isolating mechanism) having components disposed at three or four locations, for supporting the barrel supporting structure 11 and the base table 12. The air mount mechanism 13 serves to insulate vibration to be transmitted from the floor to the base table 12 and the barrel supporting structure 11.

In the drawing, the barrel supporting structure 11 provides a reference structure for alignment between the reticle 2 and the wafer (not shown) placed on the wafer chuck 4.

As a feature of this embodiment, since the position and posture of the top stage 5 with respect to six axial directions can be detected by laser interferometers mounted on the barrel supporting structure 11, even if the X stage 51 or the Y stage 54 moves through a long stroke, there is a small measurement error due to the influence of the surface precision of the guide for the stage base 55 or to deformation of the base table 12. Thus, high precision alignment between the reticle 2 and the wafer (not shown) placed on the wafer chuck 4 is accomplished.

In the exposure apparatus of this embodiment, the stage base and the barrel supporting structure are combined integrally with each other, and both of the stage base and the barrel supporting structure are insulated against vibration from the floor, by means of the air mount mechanism. However, the stage base and the barrel supporting structure may be supported by separate air mount mechanisms, such as that in a semiconductor exposure apparatus shown in FIG. 10.

In accordance with this embodiment of the present invention, in a simple structure, the laser beams parallel to the X-Y plane are projected to the reflection surface 131b being inclined by 45 deg. with respect to the X-Y plane, by which the position of the stage in the Z direction can be measured. Further, in this embodiment, while using the supporting structure for supporting the interferometers as a reference, the position and posture of the top stage with respect to six axial direction can be measured directly. As a result of this, there is no necessity of using plural sensors disposed in series. Additionally, the position measurement to the top stage with respect to the Z direction can be made directly without use of a relative sensor for detecting a displacement between the X stage and the top stage. This effectively reduces position measurement error in the Z direction.

Laser light to be projected on a mirror for stage position measurement comprises laser lights parallel to the X-Y plane. As a result, the structure of the position measuring system with a laser interferometer can be simplified.

When a positioning system having such a measuring system is incorporated into a semiconductor exposure apparatus, the position or posture of a wafer can be measured very precisely. This ensures high precision exposure. Further, simplification of the stage measuring system accomplishes a reduction in size and weight of the exposure apparatus as well as a reduction in cost of the same.

Use of the measuring system described above is not limited to a wafer stage system. It can be applied to a reticle stage system. Moreover, the measuring system with an inclined reflection surface may be applied to any positioning system for accurately positioning a movable element, with substantially the same advantageous results.

Embodiment 7

Figure 19:
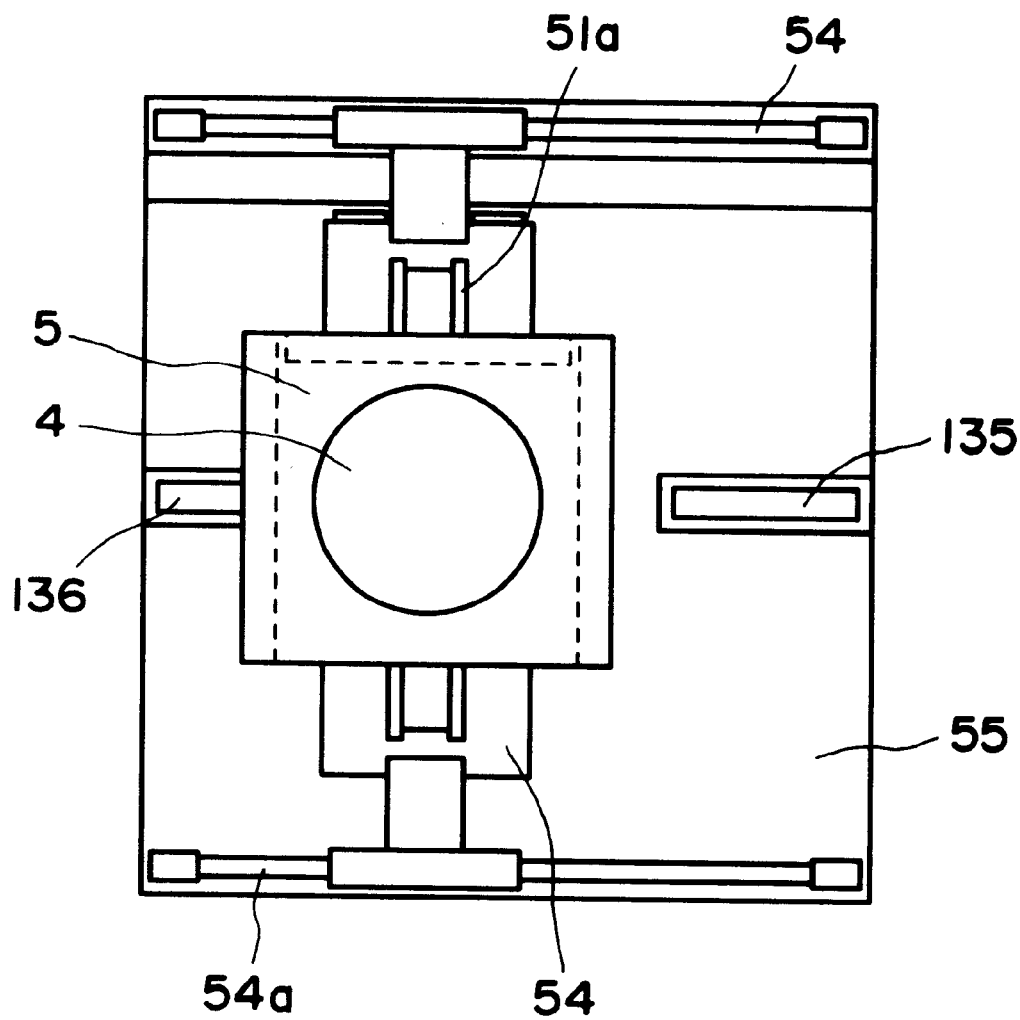
FIG. 19 is a top plan view of a wafer stage according to a seventh embodiment of the present invention.

FIG. 19 is a perspective view of a wafer stage according to a seventh embodiment of the present invention.

In FIG. 19, components corresponding to those of the preceding embodiments are denoted by the same reference numerals, and a description thereof will be omitted. In this embodiment, as compared with the preceding embodiment, there is an auxiliary mirror 129 disposed opposed to the Y mirror with respect to the Y direction.

Figure 20:
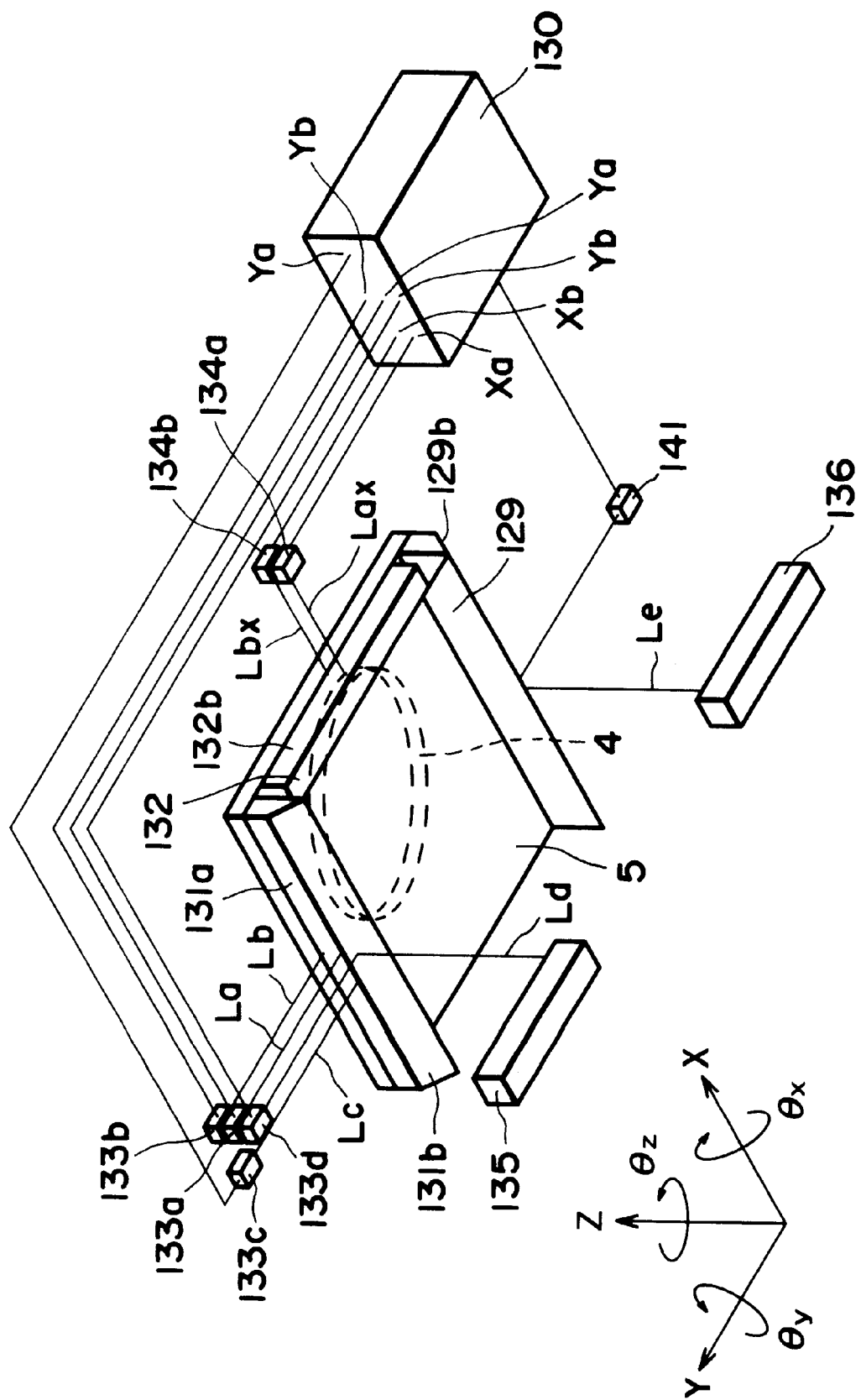
FIG. 20 is a schematic view of a measuring system according to the seventh embodiment.

FIG. 20 is a perspective view for explaining a measuring system with laser interferometers, constituting a major portion of this embodiment.

Denoted in the drawing at 130 is a control box having a computing circuit, a driving circuit and so on accommodated therein. Denoted at La, Lb, Lc, Ld, Lax, and Lbx are laser lights. Denoted at 131 is a Y mirror being mounted on the top stage 5 and having an integral structure of mirrors with a reflection surface 131a and an inclined reflection surface 131b. The reflection surface 131a comprises an optical element disposed perpendicularly to the Y-axis direction. The reflection surface 131b comprises an optical element disposed with a tilt of 45 deg. in the θx direction, with respect to the X-Y plane. Denoted at 129 is an auxiliary mirror mounted on the top stage 5 and having a reflection surface 129b. The reflection surface 129b comprises an optical element disposed with a tilt of 45 deg. in the θx direction with respect to the X-Y plane. Denoted at 132 is an X mirror mounted on the top stage 5, and it has a reflection surface 132a disposed perpendicularly to the X-axis direction.

Denoted at 133a, 132b, and 133c are interferometers for measurement with respect to the Y direction. These interferometers function to project laser lights La, Lb and Lc, each being parallel to the Y direction, upon predetermined locations on the reflection surface 131a, and, positional change information about the top stage 5 with respect to the beam incidence direction (Y-axis direction) can be detected on the basis of reflected lights from the surface 131a. Denoted at 134a and 134b are interferometers for measurement with respect to the X direction. They serve to project laser lights, each being parallel to the X direction, upon predetermined locations on the reflection surface 132a, and, positional change information of the top stage 5 with respect to the beam incidence direction (X-axis direction) can be detected on the basis of reflected lights from the surface 132a.

Denoted at 133d is an interferometer disposed in alignment with the interferometer 133a with respect to the Z-axis direction. It projects laser light Ld to the reflection surface 131b along the Y-axis direction. Denoted at 141 is an interferometer disposed opposed to the interferometer 133d, and it projects laser light Le onto a predetermined location on the reflection surface 131b along the Y-axis direction.

The laser lights impinging on the reflection surfaces 131b and 129b are substantially parallel to the Y-axis direction, and they advance in opposite directions.

These interferometers 133a, 132b, 133c, 133d, 134a, 134b and 141 are fixedly supported by a support structure (not shown) which provides a measurement reference. Denoted at 134 is a first fixed mirror having a reflection mirror surface facing in the positive Z direction, for deflecting (reflecting) laser light, coming from the interferometer 133d and being deflected by the reflection surface 131b, backwardly along its beam incidence direction (Z-axis direction). The first fixed mirror 135 has a length corresponding to about a half of the movement amount of the top stage 5 in the Y-axis direction, and it is fixedly supported by the base table 55. Denoted at 136 is a second fixed mirror having a reflection mirror surface facing in the positive z direction, for deflecting (reflecting) laser light Le, coming from the interferometer 141 and being deflected by the reflection surface 129b, backwardly along its beam incidence direction (Z-axis direction). The second fixed mirror 136 has a length (dimension in the Y-axis direction) corresponding to about a half of the movement amount of the top stage 5 in the Y-axis direction, and it is fixedly supported by the unshown support structure which provides a measurement reference.

The positions of the mirrors 131, 132, and 129, that is, the initial position of the top stage 5 has been memorized in the control box 130. The current position of the top stage 5 can be obtained by adding, to this initial position, the integrated value of displacements of the mirrors 131 and 132 measured by laser interferometers. Position measurement to the stage in the X and Y directions can be performed by use of the laser interferometers 133a and 134a. Also, rotational amount measurement to the stage with respect to the θz direction can be performed by detecting any difference between detected values of the laser interferometers 133a and 133c and by processing it within the control box 130. Rotational amount measurement to the stage with respect to the θx direction can be performed by detecting any difference between detected values of the laser interferometers 133a and 133b and by processing it within the control box 130. Rotational amount measurement to the stage with respect to the θy direction can be performed by detecting any difference between detected values of the laser interferometers 134a and 134b and by processing it within the control box.

Position measurement to the stage with respect to the Z direction can be performed by detecting the detected values of the laser interferometers 133a and 133d or of the laser interferometers 141 and 133a and by processing it inside the control box 30. Details of this will be described later.

Figure 21:
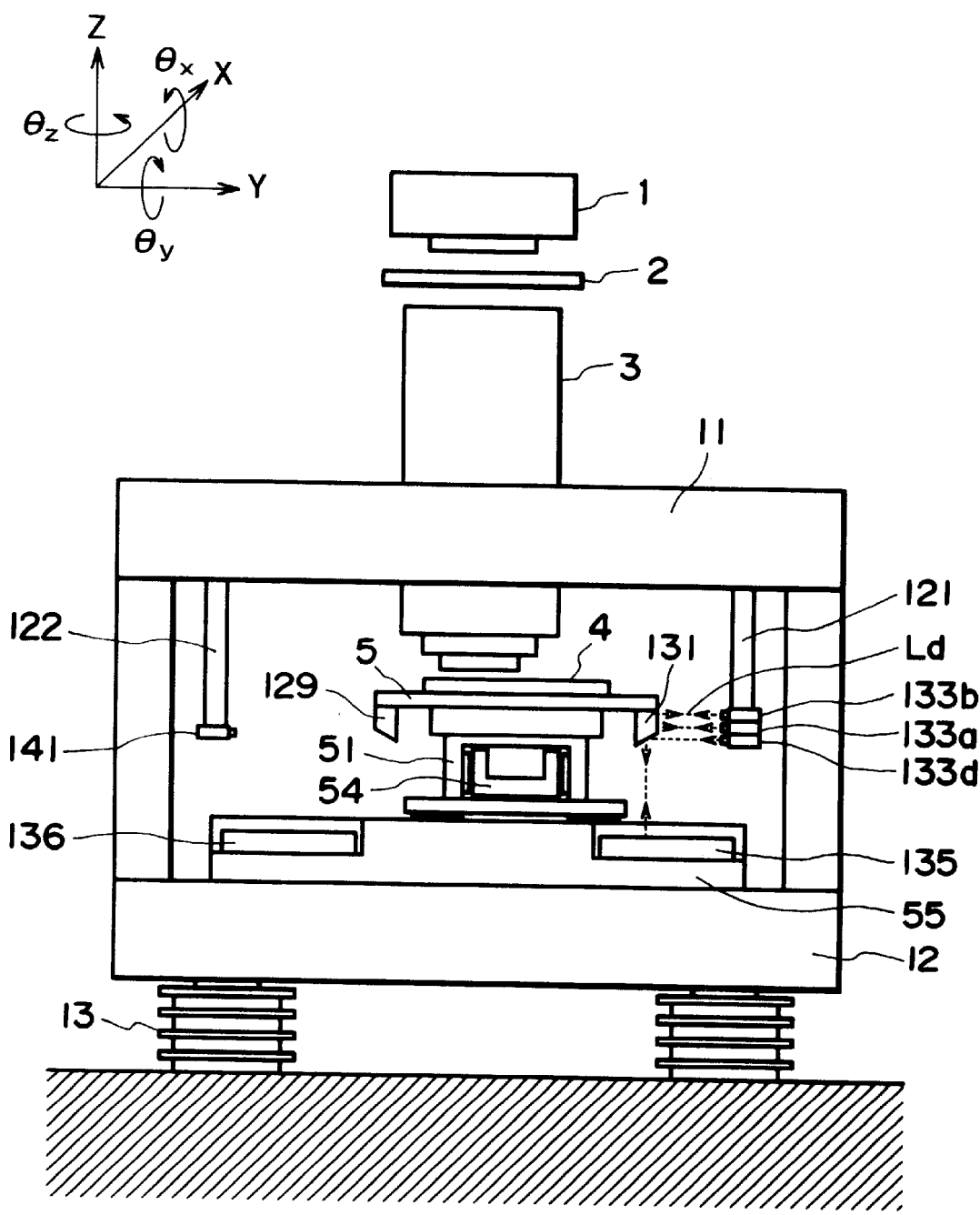
FIGS. 21 and 22 are front views, respectively, of an exposure apparatus having a measuring system according to the seventh embodiment.
Figure 22:
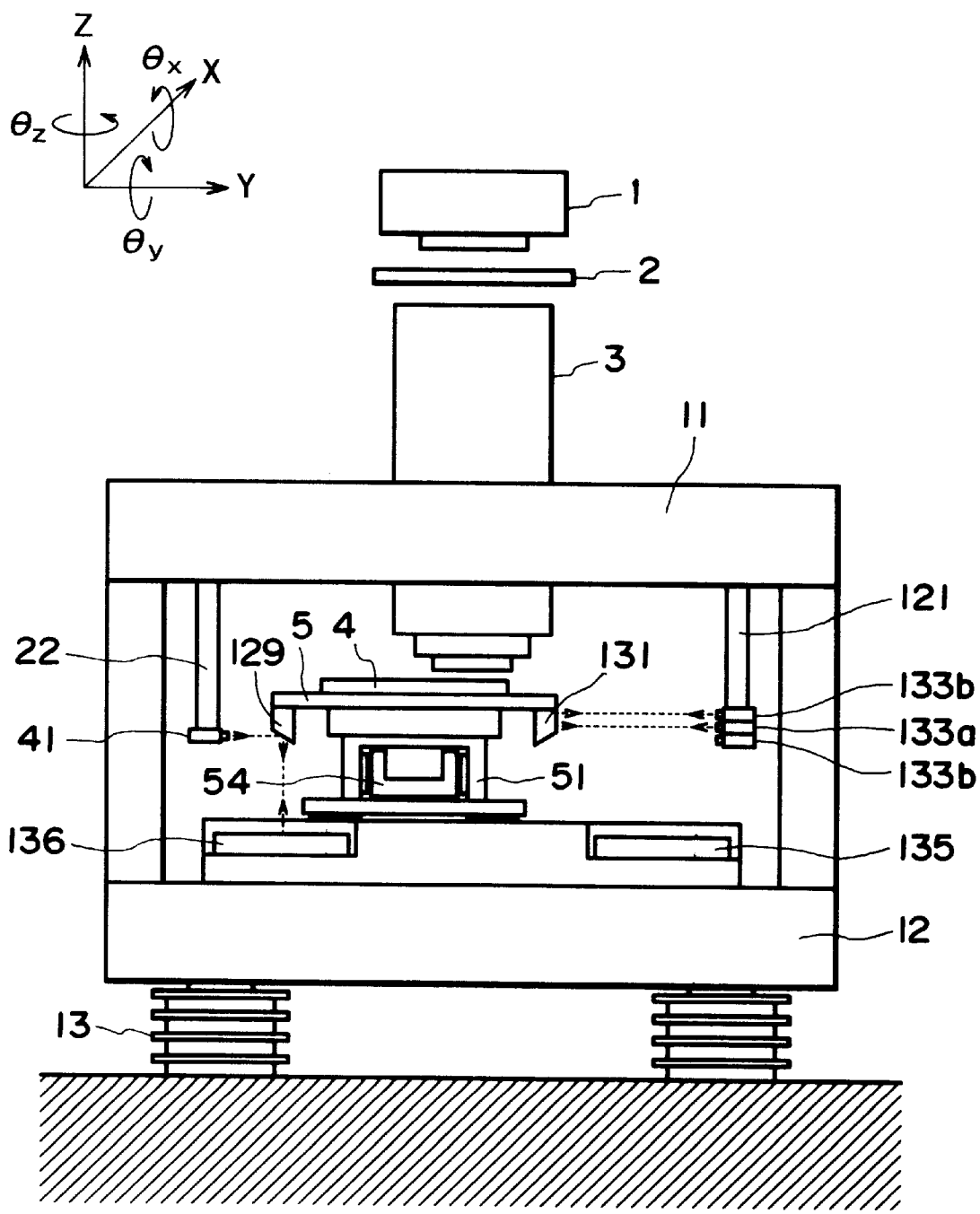

FIGS. 21 and 22 are front views, respectively, of a semiconductor exposure apparatus having a stage system according to this embodiment. Components corresponding to those of the exposure apparatus of the preceding embodiment are denoted by the same reference numerals, and a description thereof will be omitted here.

Denoted in these drawings at 121 is a mounting member for fixedly mounting the interferometers 133a, 133b and 133c to the barrel supporting structure 11. Denoted at 122 is a mounting member for fixedly mounting the interferometer 141 to the barrel supporting structure. The remaining interferometers, not shown in this drawing, are similarly fixedly supported by the barrel supporting structure. Also, the first and second fixed mirrors 135 and 136 are fixedly mounted on the barrel supporting structure.

In FIGS. 21 and 22, when the top stage 5 is placed on the positive Y-axis direction side of the optical axis center of the projection optical system 3, the laser light Le from the laser interferometer 141 is blocked by a shutter (not shown). Here, position measurement with respect to the Z direction is performed by detecting and processing the detected values of the laser interferometers 133a and 133d.

Also, when the top stage 5 is positioned about the optical axis center of the projection optical system 3, both of the laser interferometers 133d and 141 enable position measurement simultaneously. Here, on the basis of the positional information of the top stage 5, a measured value of one of the interferometers 133d and 141 is initialized and, after that, the laser light from the other interferometer is blocked. Thus, selective switching is made.

As a feature of this embodiment, in addition to the advantageous results of the preceding embodiment, the interchanging of laser interferometers in accordance with the position of the top stage enables a reduction in size of the mirror member to be mounted on the top stage. This enables a reduction in size of the top stage and, therefore, a decrease of unstable positioning error factor due to thermal deformation of the top stage, for example. Further, since the weight of the top stage can be lightened, the natural vibration frequency of the stage can be made higher. This effectively improves the positioning control performance. As a result, high precision and high speed alignment between reticle and a wafer (not shown) placed on the wafer chuck is accomplished.

In the exposure apparatus of this embodiment, the stage base and the barrel supporting structure are combined integrally with each other, and both of the stage base and the barrel supporting structure are insulated against vibration from the floor, by means of the air mount mechanism. However, the stage base and the barrel supporting structure may be supported by separate air mount mechanisms, such as that in a semiconductor exposure apparatus shown in FIG. 10.

Embodiment 8

Figure 23:
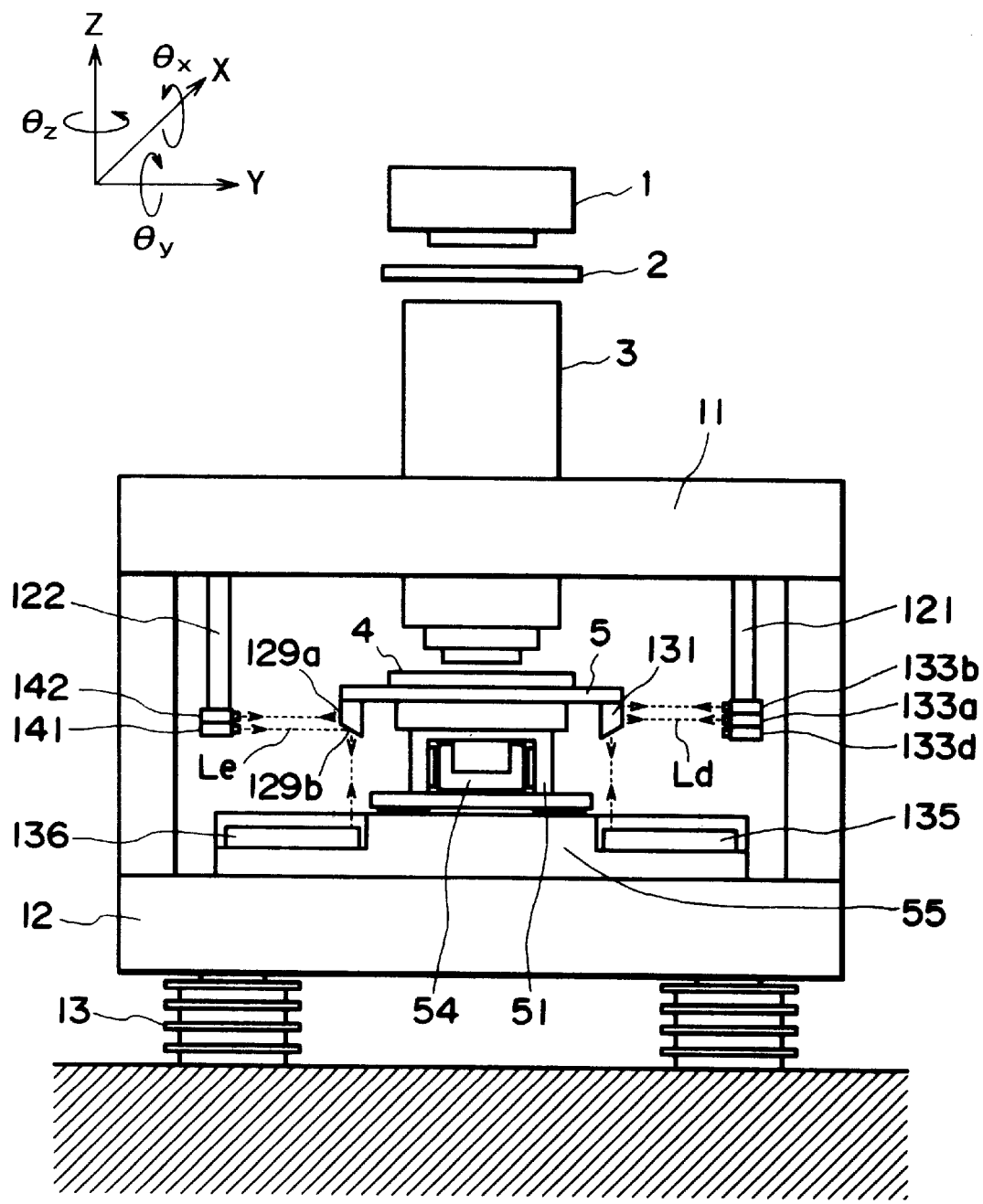
FIG. 23 is a front view of an exposure apparatus having a measuring system according to an eight embodiment of the present invention.

FIG. 23 is a front view of a semiconductor exposure apparatus according to an eighth embodiment of the present invention.

In FIG. 23, components corresponding to those of the preceding embodiments are denoted by the same reference numerals.

Denoted in the drawing at 129 is an auxiliary mirror mounted on the top stage 5. This auxiliary mirror 129 has two reflection surfaces, that is, a reflection surface 129a and an inclined reflection surface 129b. This differs from the preceding embodiment.

The reflection surface 129a is disposed perpendicularly to the Y-axis direction, while the reflection surface 129b is disposed with a tilt by 45 deg. in the θx direction with respect to the X-Y plane. Denoted at 142 is an interferometer for measurement with respect to the Y direction. It serves to project laser light Lf onto a predetermined location on the reflection surface 129a, and positional change information of the top stage 5 with respect to the beam incidence direction (Y-axis direction) can be detected on the basis of reflection light from the surface 29a.

When in FIG. 23 the top stage 5 is placed on the positive Y-axis direction side of the optical axis center of the projection optical system, the laser light Le from the laser interferometer 141 is blocked by a shutter (not shown). Here, position measurement to the top stage 5 with respect to the Z direction is performed by detecting and processing a difference between the detected values of the laser interferometers 133a and 133d. When the top stage 5 is positioned on the negative Y-axis direction side of the optical axis center of the projection optical system, the laser light Ld from the laser interferometer 133d is blocked by a shutter (not shown). Here, position measurement to the top stage 5 with respect to the Z direction can be performed by detecting and processing a difference between the detected values of the laser interferometers 142 and 141. When the top stage 5 is positioned about the optical axis center of the projection optical system, both of the laser interferometers 133d and 141 enable position measurement simultaneously. When both of the laser interferometers 133d and 141 perform the position measurement to the top stage 5, on the basis of the positional information of the top stage 5, one of the interferometers 133d and 141 is initialized and, after that, the laser light from the other interferometer is blocked. Thus, selective switching is made.

This embodiment provides substantially the same advantageous effects as those of the preceding embodiment.

Embodiment 9

Figure 24:
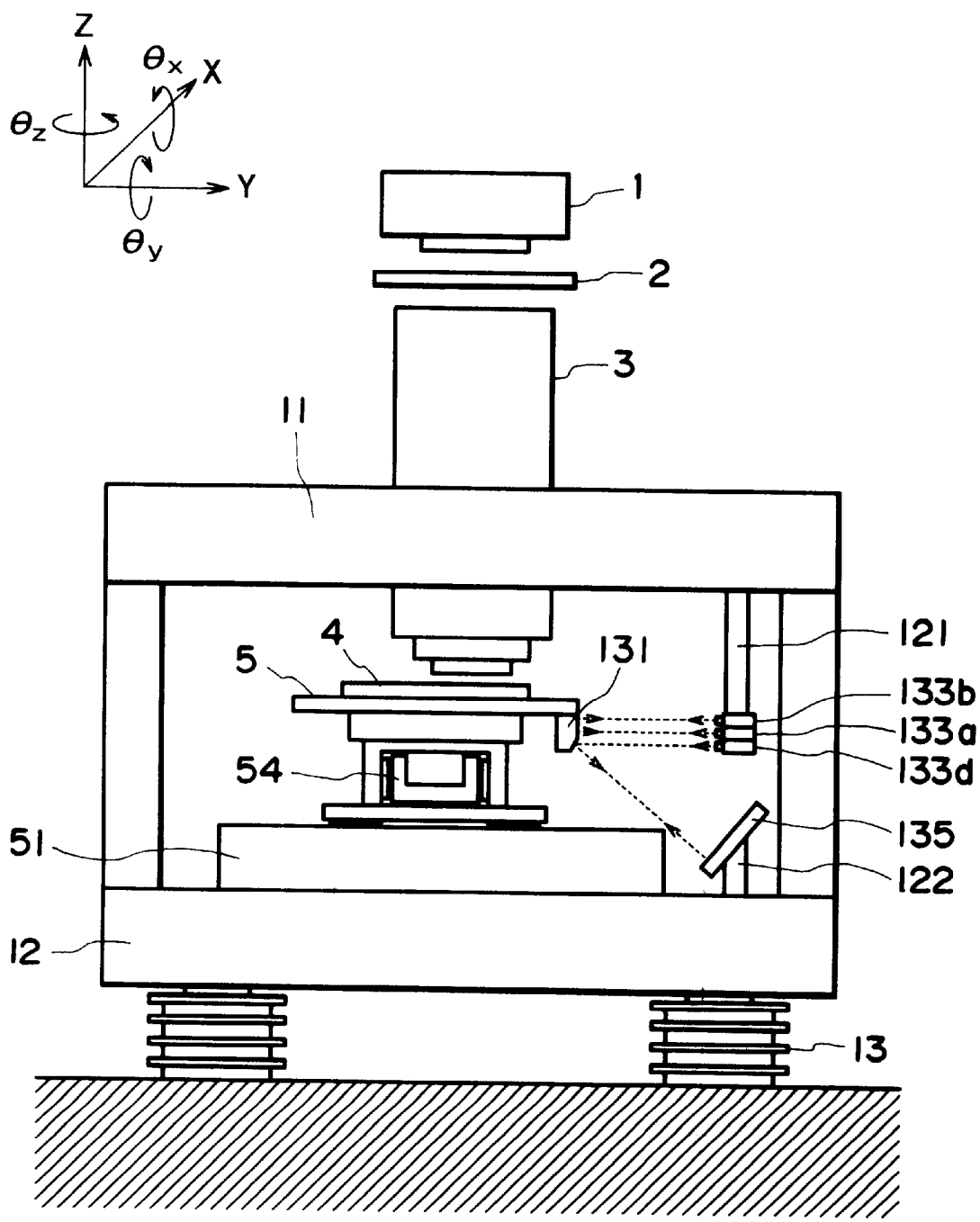
FIG. 24 is a front view of an exposure apparatus having a measuring system according to a ninth embodiment of the present invention.

FIG. 24 is a front view of a semiconductor exposure apparatus according to a ninth embodiment of the present invention.

In FIG. 24, components corresponding to those of the preceding embodiments are denoted by the same reference numerals, and a description thereof will be omitted here.

Denoted in the drawing at 131 is a mirror for reflecting, at an acute angle, the laser light projected thereto from the laser interferometer 133d. It is mounted on the top stage 5. Denoted at 135 is a mirror mounted with a predetermined angle on the barrel supporting structure, for deflecting the laser light reflected by the mirror 131, backwardly.

Figure 25:
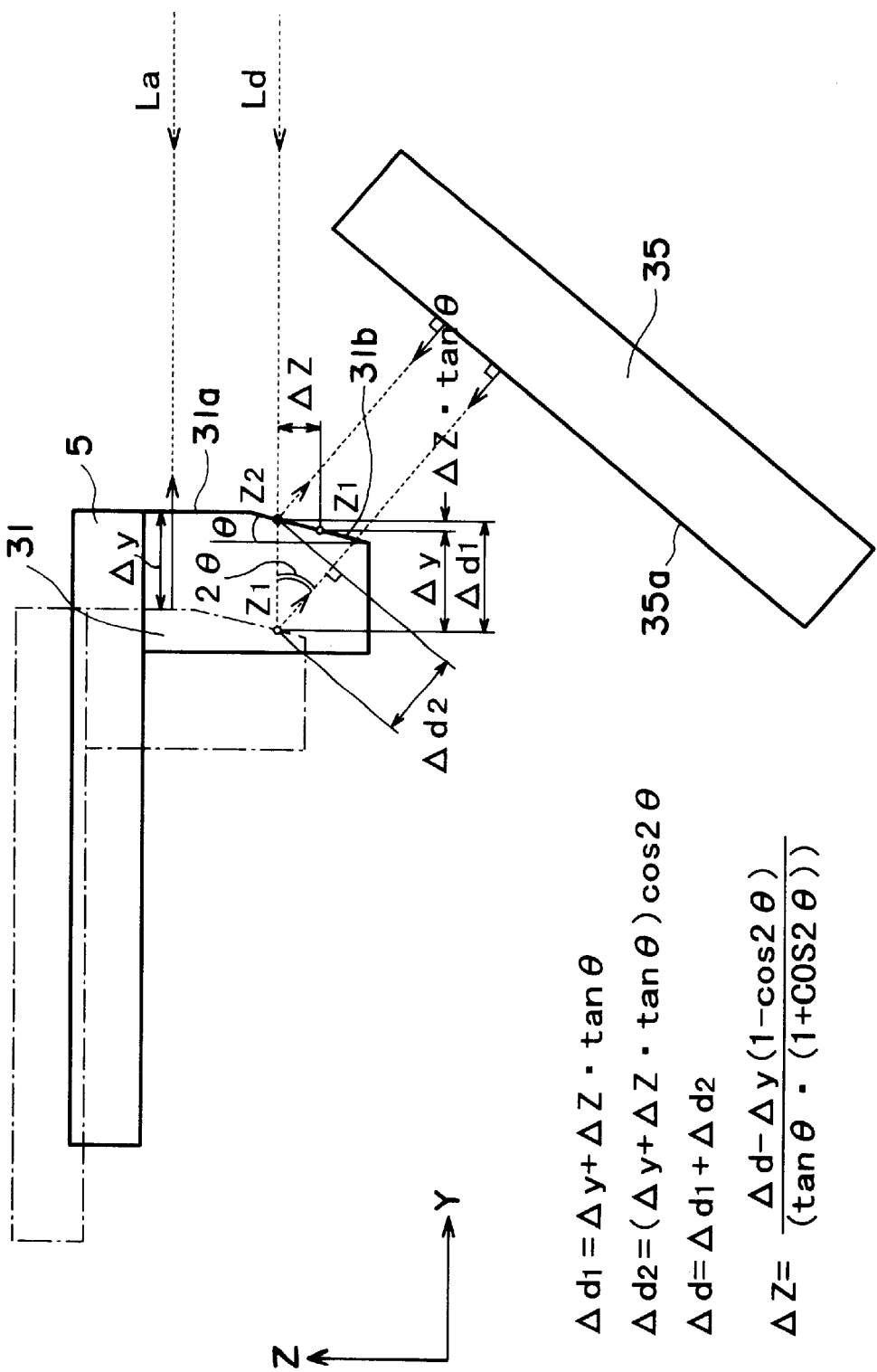
FIG. 25 is a schematic view for explaining position measurement with respect to a Z direction, in the ninth embodiment.

FIG. 25 is a schematic view for explaining details of position measurement in the Z direction.

The laser light Ld projected from the laser interferometer 133d is deflected by the reflection surface 131b at a predetermined angle so that it bears a negative Z direction component. The laser light is then projected on the reflection surface 135a of the fixed mirror 135, and it is reflected backwardly. Here, a change in detected value of the laser interferometer 133d as the laser light Ld shifts on the reflection surface 131b from its initial incidence point Z1 to a current incidence point Z2 is denoted by Δd, and a change in detected value of the laser interferometer 33a is denoted by Δy.

Here, as illustrated, a change $\Delta d_1$ of the laser light Ld in the X-axis direction and a change $\Delta d_2$ in the direction of reflection can be determined in accordance with the following equations:

$$\Delta d_1 = \Delta y + \Delta z \tan \theta$$

$$\Delta d_2 = (\Delta y + \Delta z \tan \theta)\cos 2\theta.$$

Thus, a change Δz of detected value in the Z direction can be determined, by using the change Δd of detected value of the laser interferometer 133d, in accordance with the following equation:

$$\Delta z = [\Delta d - \Delta y(1 - \cos 2\theta)]/[\tan \theta(1 + \cos 2\theta)].$$

The exposure apparatus of the above-described structure provides substantially the same advantageous effects as those of the preceding embodiment. Additionally, since the mirror is inclined so that an acute angle is defined between projected light and reflected light, the fixed mirror can be mounted on the barrel supporting structure 11 so as to avoid mechanical interference with the projection optical system. This enables a reduction in size of the top stage 5 with respect to the X direction. Also, there is no need for mounting the fixed mirror on the base table. Thus, the structure of the base table can be made simple.

As a feature of this embodiment, since the size of the top stage can be made smaller, an unstable positioning error factor due to thermal deformation of the top stage, for example, can be reduced. Further, because of a reduction in weight of the top stage, the natural vibration frequency of the stage can be made higher. This effectively improves the positioning control performance. As a result, high precision and high speed alignment between a reticle 2 and a wafer (not shown) placed on the wafer chuck 4 is accomplished.

While this embodiment uses a mirror having an inclined reflection surface, being inclined with respect to the reference plane, the optical element is not limited to this. For example, a reflection type or transmission type diffraction grating may be used for deflection of inputted light. Such a diffraction grating may be one wherein a large number of slits is formed in a direction parallel to the reference plane. The grating surface may be perpendicular to or inclined to the reference plane. When measurement light impinges on the grating surface in a direction substantially parallel to the reference plane, higher order diffraction light is produced in the Z direction. By using such higher order diffraction light (e.g., first order light), the position of the stage in the Z direction can be measured. When a diffraction grating is provided having its grating surface disposed perpendicularly to the incidence measurement beam, only a shift of the stage in the Z direction does not cause a change in length of an optical path of the measurement light. However, when the diffraction grating shifts in the Z direction, it causes a change in phase of first-order diffraction light. Thus, by measuring the phase change through an interferometer, a shift of the stage in the Z-axis direction can be measured.

Further, while this embodiment uses a mirror for reflecting the measurement beam at an acute angle, this is not a requisition. The reflection may be made with an obtuse angle.

Namely, an essential feature of this embodiment is that the measurement beam is deflected by an optical element so that it bears a Z-axis direction component. Provided that the light deflected by the optical member has a component in the Z-axis direction, the position of the stage in the Z direction can be detected.

Embodiment 10

Figure 26:
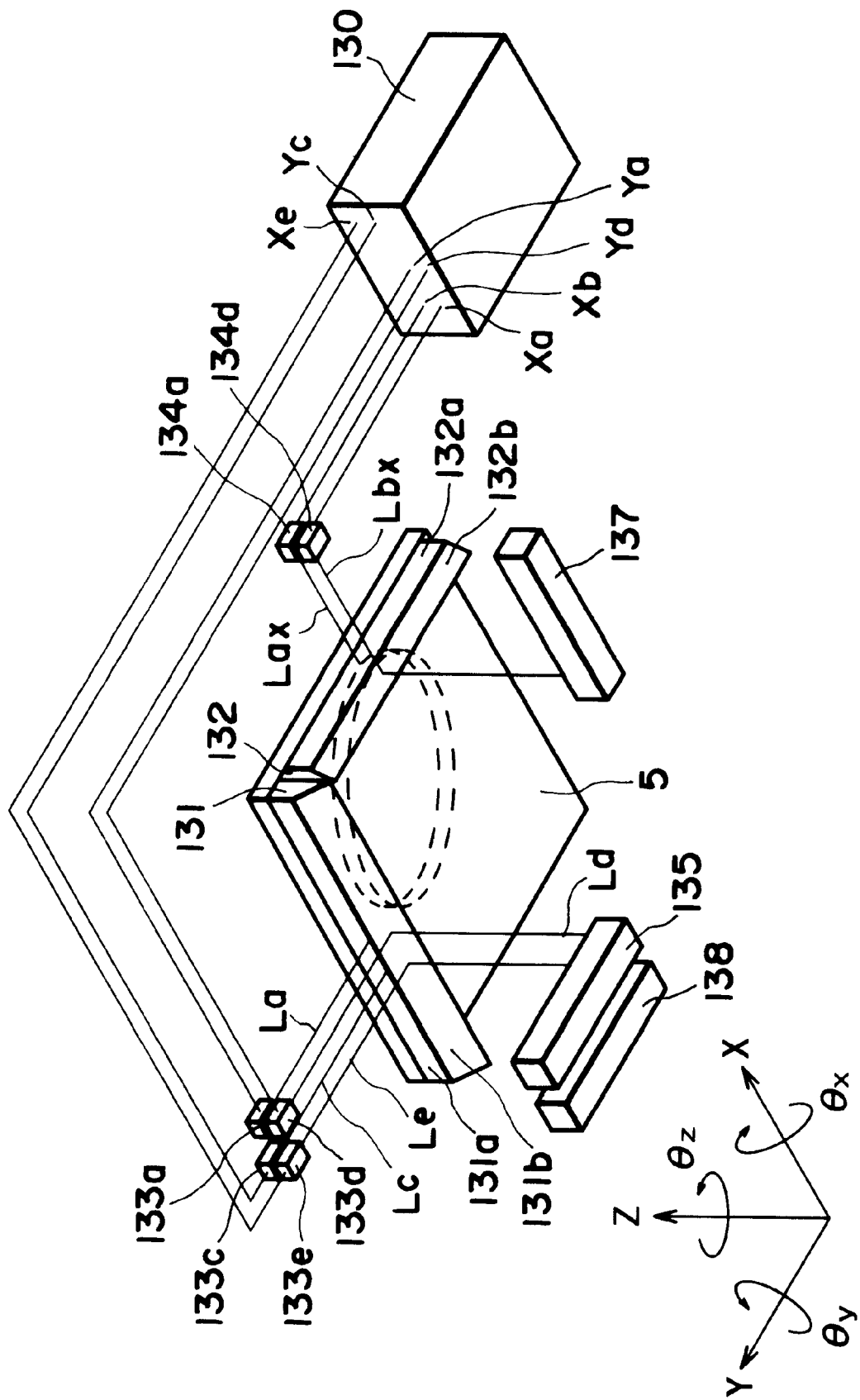
FIG. 26 is a perspective view of a measuring system according to a tenth embodiment of the present invention.

FIG. 26 is a perspective view of a measuring system with a laser interferometer, which constitutes a major portion of this embodiment.

In FIG. 26, components corresponding to those of the preceding embodiments are denoted by the same reference numerals, and a description thereof will be omitted here.

Denoted in the drawing at 130 is a control box having a computing circuit, a driving circuit and so on accommodated therein. Denoted at La, Lb, Lc, Ld, Lax, and Ldx are laser lights for position measurement. Denoted at 131 is a Y mirror being mounted on the top stage and having an integral structure of mirrors with reflection surfaces 131a and 131b. The reflection surface 131a comprises an optical element disposed perpendicularly to the Y-axis direction. The reflection surface 131b comprises an optical element disposed with a tilt of 45 deg. in the θx direction, with respect to the X-Y plane. Denoted at 132 is an X mirror mounted on the top stage 5, and it has an integral structure of mirrors with reflection surfaces 132a and 132b. The reflection surface 132a comprises an optical element disposed perpendicularly to the X-axis direction, while the reflection surface 132b comprises an optical element disposed with a tilt by 45 deg. in the θy direction with respect to the X-Y plane.

Denoted at 133a and 133c are interferometers for measurement with respect to the Y direction. These interferometers function to project laser lights upon predetermined locations on the reflection surface 131a, and, positional change information about the top stage 5 with respect to the beam incidence direction (Y-axis direction) can be detected on the basis of reflected lights from the surface 131a. Denoted at 134a is an interferometer for measurement with respect to the Y direction. It serves to project laser light to predetermined locations on the reflection surface 132a, and, positional change information of the top stage 5 with respect to the beam incidence direction (X-axis direction) can be detected on the basis of reflected lights from the surface 132a.

Denoted at 133d is an interferometer disposed in alignment with the interferometer 133a with respect to the Z-axis direction. It projects laser light Ld, which is above or below the laser light La from the interferometer 133a and is parallel thereto, onto a predetermined location on the reflection surface 131b along the Y-axis direction. Denoted at 133e is an interferometer disposed in line with the interferometer 133c with respect to the Z direction. It projects laser light Le, which is above or below the laser light Lc from the interferometer 133c and is parallel thereto, onto a predetermined location on the reflection surface 131b along the Y-axis direction. Denoted at 134d is an interferometer disposed in line with the interferometer 134a with respect to the Z direction. It projects laser light Lbx, which is above or below the laser light Lax from the interferometer 134a and is parallel thereto, onto a predetermined location on the reflection surface 132b along the X-axis direction.

Denoted at 135 and 138 are first and second fixed mirrors for reflecting the laser lights, projected from the interferometers 133d and 133e and reflected by the reflection surface 131b, backwardly along their beam incidence directions (Z-axis direction). Each of these mirrors has a reflection mirror surface facing in the position Z direction, and has a length corresponding to the movement amount of the top stage 5 in the Y-axis direction. These mirrors are fixedly mounted on a base table.

Denoted at 137 is a third fixed mirror for reflecting the laser light projected from the interferometer 134d and reflected by the reflection surface 132b backwardly along its beam incidence direction (Z-axis direction). It has a reflection surface facing in the positive Z direction, and has a length corresponding to the movement amount of the top stage 5 in the X-axis direction. It is fixedly mounted on the base table.

The positions of the mirrors 131 and 132, that is, the initial position of the top stage 5 has been memorized in the control box 130. The current position of the top stage 5 can be obtained by adding, to this initial position, the integrated value of displacements of the mirrors 131 and 132 measured by laser interferometers. Position measurement to the stage in the X and Y directions can be performed by use of the laser interferometers 133a and 134a. Also, rotational amount measurement to the stage with respect to the θz direction can be performed by detecting any difference between detected values of the laser interferometers 133a and 133c and by processing it within the control box 130. Rotational amount measurements to the stage with respect to the θx and θy directions can be performed on the basis of the detected values of the laser interferometers 133d, 133e and 134d, and by processing the result within the control box 130.

It is important in this embodiment that three laser lights are projected on the inclined reflection surface. This is because it enables detection of positional information in the Z direction at these locations, which in turn enables position measurement to the stage in the Z direction as well as rotational amount detection in the θx and θy directions. To this end, in this embodiment, a total of three laser lights is projected on two inclined reflection surfaces. However, the structure is not limited to this. For example, three inclined surfaces may be prepared and laser light may be projected to them.

In accordance with this embodiment, three laser lights parallel to the X-Y plane are projected on a reflection surface being inclined by 45 deg. with respect to the X-Y plane, by which position measurement to the stage with respect to the Z direction and rotational amount detection in the θx and θy directions are performed. This enables direction measurement by using the supporting structure for supporting the interferometers as a reference. As a result, there is no necessity of using plural sensors disposed in series. Further, since position measurement to the stage in the Z direction and rotational amount detection in the θx and θy directions can be done directly without use of a relative sensor for detecting relative displacement between the X stage and the top stage, measurement error can be reduced significantly.

Moreover, since detection of rotational amount of the stage in the θx and θy directions is performed by projecting three laser lights, parallel to the X-Y plane, to the reflection surfaces 31b and 32b being inclined by 45 deg. with respect to the X-Y plane, the widths in the Z direction of the reflection surface 31a perpendicular to the X direction and of the reflection surface 32a perpendicular to the Y direction, can be reduced. This enables lightening in weight of the mirror and enlargement of the natural vibration frequency of the stage. The positioning control performance can therefore be improved. Thus, high speed and high precision alignment of a wafer (not shown) placed on the wafer chuck is accomplished.

The stage system of this embodiment may be applied to a reticle stage of an exposure apparatus, with substantially the same advantageous results described above and with substantially the same advantageous effects as those of the exposure apparatus described hereinbefore.

Embodiment 11

Next, an embodiment of a semiconductor device manufacturing method which uses an exposure apparatus according to any one of the preceding embodiments, will be explained.

Figure 27:
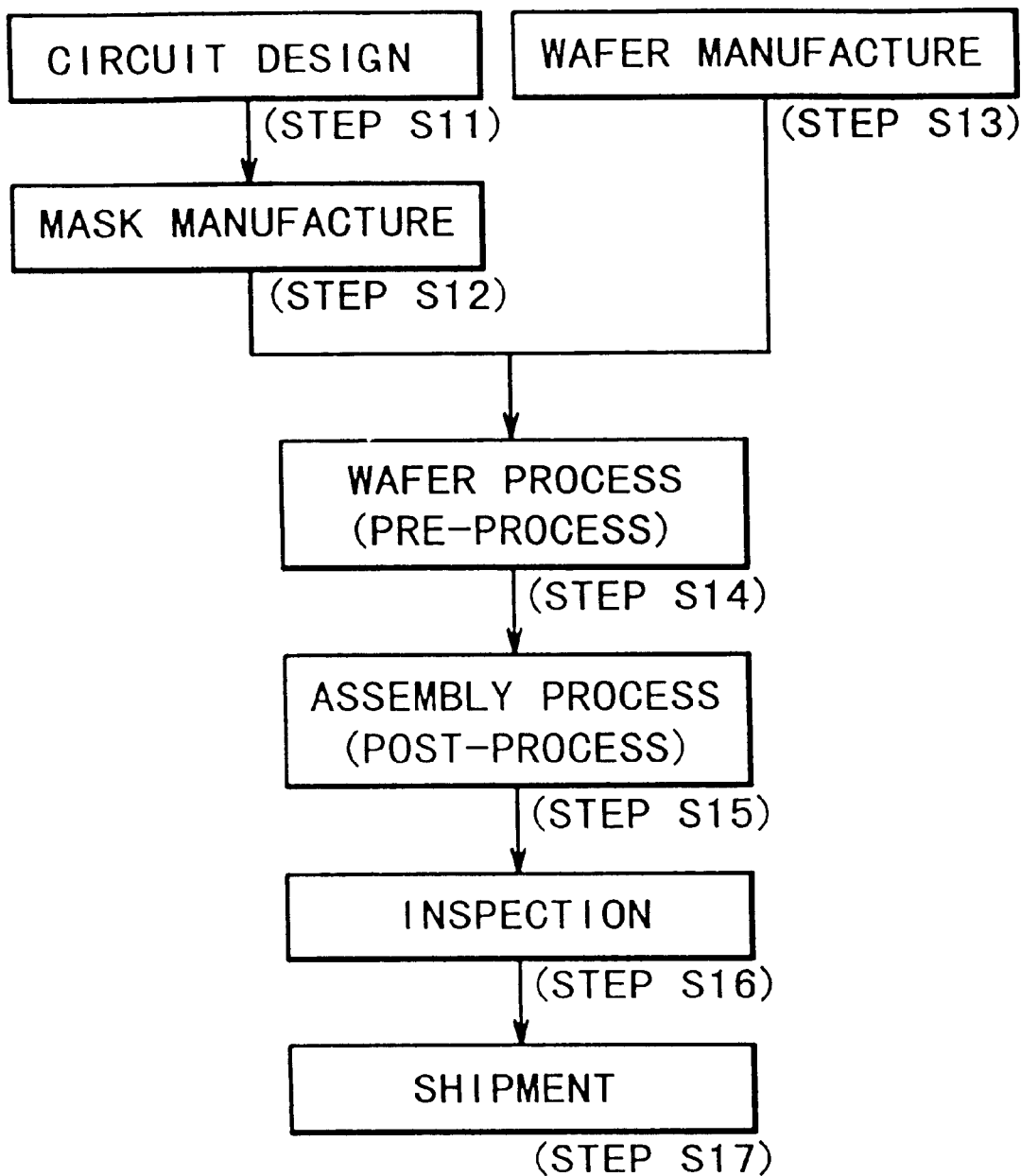
FIG. 27 is a flow chart explaining semiconductor device manufacturing processes.

FIG. 27 is a flow chart of a procedure for the manufacture of microdevices such as semiconductor chips (e.g., ICs or LSIs), liquid crystal panels, CCDS, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a preprocess wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 28:
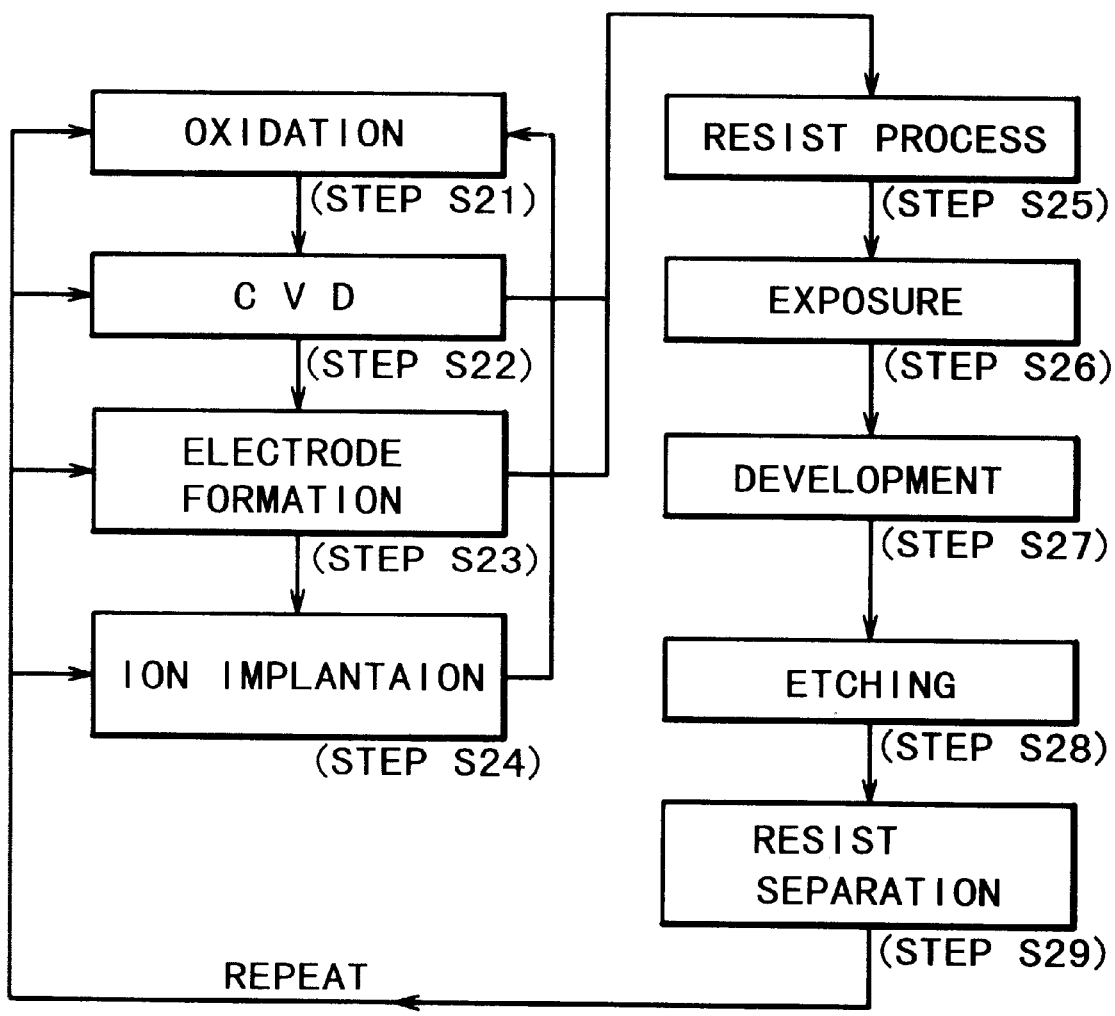
FIG. 28 is a flow chart for explaining a wafer process.
Figure 29:
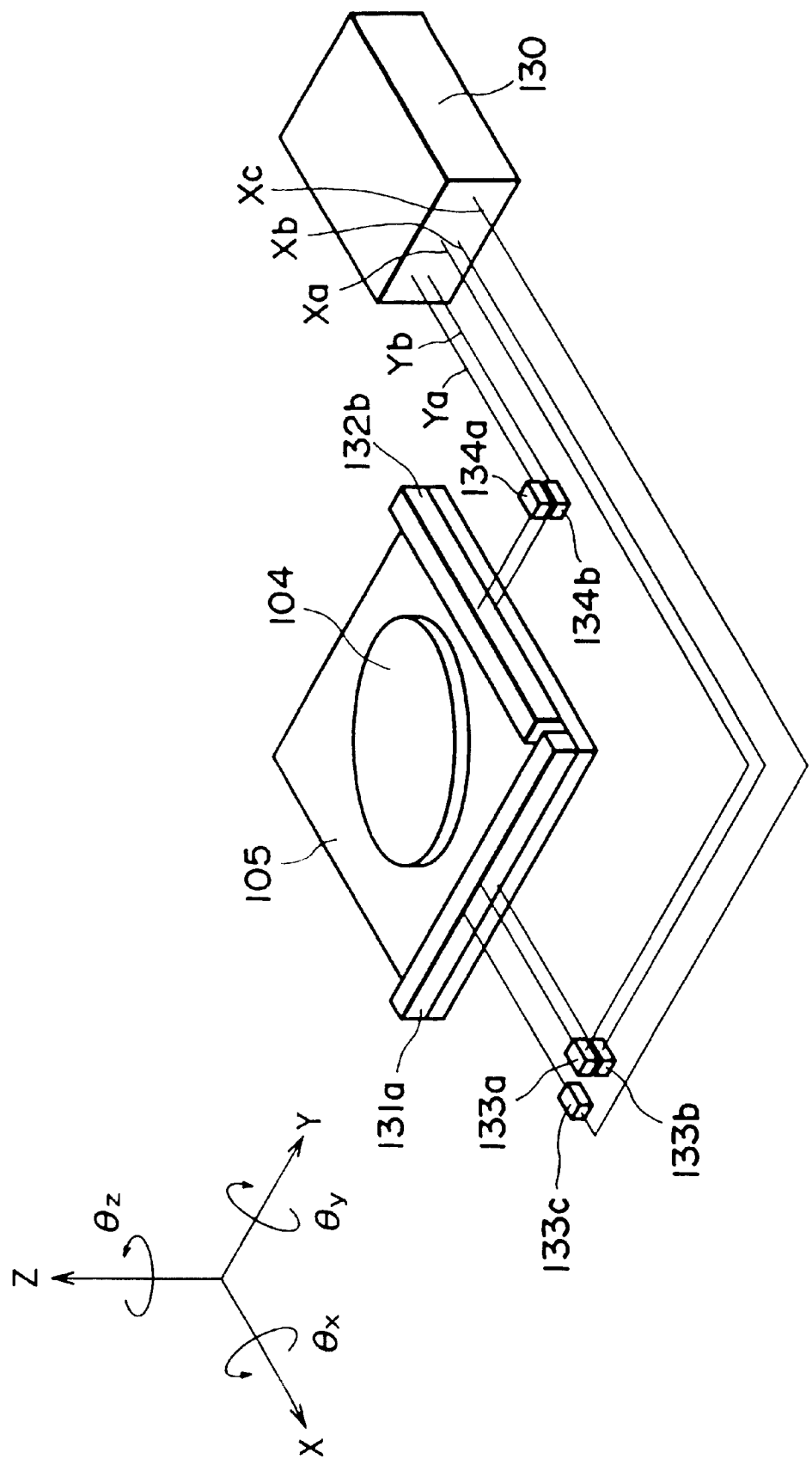
FIG. 29 is a perspective view of a conventional measuring system.

FIG. 28 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A positioning system, comprising:
   a movable member being movable along a reference plane, and including a plurality of elements each having a reflection surface inclined with respect to the reference plane; and
   a position measuring device for measuring positional information related to said movable member, said position measuring device including measuring means for causing a measurement beam to be reflected by said inclined reflection surfaces and for detecting positional information related to said movable member with respect to a direction intersecting the reference plane, wherein said position measuring device selectively measures a reflection beam from any one of said inclined reflection surfaces.

2. A positioning system according to claim 1, wherein the inclined reflection surfaces each includes a reflection surface portion for reflecting the measurement beam, projected thereto from said position measuring device parallel to the reference plane, in a direction intersecting the reference plane.

3. A positioning system according to claim 1, further comprising a fixed mirror mounted on a stationary member and having a reflection surface with a direction of a normal thereto extending to intersect the reference plane, wherein the measurement beam reflected by said inclined reflection surfaces is then reflected by said fixed mirror in a direction opposite to a beam path of the measurement beam.

4. A positioning system according to claim 1, wherein the measurement beam reflected by said inclined reflection surfaces advances in a direction away from the reference plane.

5. A positioning system according to claim 1, wherein the measurement beam reflected by said inclined reflection surfaces advances in a direction close to the reference plane.

6. A positioning system according to claim 2, wherein said position measuring device detects the positional information related to the movable member with respect to a direction intersecting the reference plane, on the basis of a reflection beam reflected by said fixed mirror.

7. A positioning system according to claim 1, wherein said inclined reflection surfaces each comprises a reflection surface inclined by forty-five degrees with respect to the reference plane.

8. A positioning system according to claim 1, wherein the direction intersecting the reference plane is orthogonal to the reference plane.

9. A positioning system according to claim 1, wherein the measurement beam impinging on said inclined reflection surfaces and a reflected beam reflected by said inclined reflection surfaces define an acute angle therebetween.

10. A positioning system according to claim 1, wherein a measurement beam parallel to the reference plane is used to detect information about the movable member with respect to six axial directions.

11. A positioning system according to claim 1, wherein said movable member includes a first mirror to be used for position measurement to said movable member with respect to the first direction, and a second mirror to be used for position measurement to said movable member with respect to the second direction.

12. A positioning system according to claim 11, wherein said first mirror serves to reflect a measurement beam, parallel to the first direction, in a direction parallel to the first direction.

13. A positioning system according to claim 11, wherein said second mirror serves to reflect a measurement beam, parallel to the second direction, in a direction parallel to the second direction.

14. A positioning system according to claim 11, wherein the first and second directions intersect with each other at a right angle.

15. A positioning system according to claim 11, wherein said inclined reflection surface is provided integrally with at least one of said first and second mirrors.

16. A positioning system according to claim 15, wherein said position measuring device includes first and second measuring means for performing measurement in relation to two different locations on said first mirror, third and fourth measuring means for performing measurement in relation to two different locations on said second mirror, fifth measuring means for performing measurement in relation to a third location placed out of a straight line connecting the two locations on said first mirror, and sixth measuring means for detecting a reflection beam coming via said inclined reflection surface.

17. A positioning system according to claim 15, wherein said position measuring means includes first and second measuring means for detecting first and second measurement beams, positioned up and down and parallel to each other, third and fourth measuring means for detecting third and fourth measurement beams, positioned up and down and parallel to each other, fifth measuring means for detecting a measurement beam for performing position measurement in relation to another location on said first mirror, and sixth measuring means for detecting a reflection beam coming via said inclined reflection surfaces.

18. A positioning system according to claim 16, wherein, on the basis of the results of detection with said first to sixth measuring means, positional information and rotational information related to the movable object with respect to a direction along the reference plane, rotational information in a direction inclined with respect to the reference plane, and positional information in a direction intersecting the reference plane are detected.

19. A positioning system according to claim 1, wherein measurement beams projected to said inclined surfaces are all parallel to the reference plane.

20. A positioning system according to claim 19, wherein said position measuring device selectively measures a reflection beam from any one of said inclined reflection surfaces, on the basis of positional information of said movable member.

21. A positioning system according to claim 19, wherein any one of measurement beams projected or to be projected on said inclined reflection surfaces is blocked.

22. A positioning system according to claim 1, wherein said position measuring device includes measuring means for performing measurement in relation to different locations on said inclined reflection surfaces.

23. A positioning system according to claim 22, wherein the number of the different locations is at least three.

24. A positioning system according to claim 22, wherein reflection beam measurement is performed by use of different locations on said inclined reflection surfaces, such that positional information of said movable member in a direction inclined with respect to the reference plane and a rotational direction in a direction inclined with respect to the reference plane are detected.

25. A positioning system according to claim 22, wherein said inclined reflection surfaces each includes a first inclined reflection surface provided integrally with said first mirror, and a second inclined reflection surface provided integrally with said second mirror.

26. A positioning system according to claim 25, wherein said position measuring device includes first measuring means for performing measurement in relation to said first mirror, second measuring means for performing measurement in relation to said second mirror, third measuring means for performing measurement in relation to a different location on one of said first and second mirrors, and fourth, fifth and sixth measuring means for performing measurement in relation to three different locations on said inclined reflection surfaces.

27. A positioning system according to claim 22, wherein said position measuring means includes first, second and third measuring means for detecting positional information and rotational information of the movable member in a direction along the reference plane, and fourth, fifth and sixth measuring means for performing measurement by use of said inclined reflection surfaces and for detecting positional information of the movable member in a direction intersecting the reference plane and rotational information in a direction inclined with respect to the reference plane.

28. A positioning system according to claim 27, wherein said first and fourth measuring means detect first and fourth measurement beams, positioned up and down and parallel to each other, said second and fifth measuring means detect second and fifth measurement beams, positioned up and down and parallel to each other, and said third and sixth measuring means detect third and sixth measurement beams, positioned up and down and parallel to each other.

29. An exposure apparatus having a positioning system as recited in claim 1.

30. An apparatus according to claim 29, wherein said positioning system is provided in a portion of a wafer stage.

31. An apparatus according to claim 29, further comprising a barrel support member for supporting a projection optical system, wherein said positioning system is supported by said barrel support member.

32. An apparatus according to claim 29, further comprising a fixed mirror for reflecting a reflection beam from the inclined reflection surfaces in a direction opposite to a beam path of the reflection beam, wherein said fixed mirror is supported by said barrel support member.

33. An apparatus according to claim 29, further comprising a fixed mirror for reflecting a reflection beam from the inclined reflection surfaces in a direction opposite to a beam path of the reflection beam, wherein said fixed mirror is supported by a base for supporting said movable member.

34. An apparatus according to claim 29, further comprising a base having the reference plane and being supported integrally with said barrel support member through a vibration isolating mechanism.

35. An apparatus according to claim 29, further comprising a base having the reference plane and being supported independently through said barrel support member and a vibration isolating mechanism.

36. A positioning system according to claim 1, further comprising a shutter for blocking the measurement beam.

37. A positioning system according to claim 1, wherein initialization of a measured value for at least one of the reflection surfaces is performed when measurements using two reflection surfaces can be made.

38. A positioning system, comprising:
   a movable member being movable in a predetermined direction, and including a plurality of elements each having a reflection surface inclined with respect to the reference plane;
   an element mounted on said movable member and having a reflection surface; and
   a position measuring device for measuring the position of said movable member, said position measuring device including measuring means for projecting a measurement beam onto the reflection surfaces in a direction other than normal to the reflection surfaces to thereby detect positional information about said movable member with respect to the direction of reflection of the measurement beam, wherein said position measuring device selectively measures a reflection beam from any one of said inclined reflection surfaces.

39. A positioning system according to claim 38, wherein the reflection surfaces reflect a measurement beam, parallel to the direction other than normal to the reflection surfaces.

40. A positioning system according to claim 38, further comprising a fixed mirror mounted on a stationary portion and having a reflection surface with a normal thereto extending in a direction of the measurement beam reflected by said element with a reflection surface, wherein the reflected measurement beam is then reflected by said fixed mirror in a direction opposite to a beam path of the measurement beam.

41. A positioning system according to claim 40, wherein said position detecting device detects positional information of said movable member with respect to a direction different from the predetermined direction, on the basis of a reflected beam reflected by said fixed mirror.

42. A positioning system according to claim 38, wherein said position detecting device detects positional information of said movable member with respect to a direction orthogonal to the predetermined direction.

43. A positioning system according to claim 38, wherein the direction different from the direction of the normal is a vertical direction.

44. A positioning system according to claim 38, wherein the predetermined direction is a direction along a horizontal plane.

45. An exposure apparatus having a positioning system as recited in claim 38.

46. An apparatus according to claim 45, wherein said positioning system is provided in a portion of a wafer stage.

47. An apparatus according to claim 45, further comprising a barrel support member for supporting a projection optical system, wherein said positioning system is supported by said barrel support member.

48. An apparatus according to claim 45, further comprising a fixed mirror for reflecting a reflection beam from the inclined reflection surfaces in a direction opposite to a beam path of the reflection beam, wherein said fixed mirror is supported by said barrel support member.

49. An apparatus according to claim 45, further comprising a fixed mirror for reflecting a reflection beam from the inclined reflection surfaces in a direction opposite to a beam path of the reflection beam, wherein said fixed mirror is supported by a base for supporting said movable member.

50. An apparatus according to claim 45, further comprising a base having the reference plane and being supported integrally with said barrel support member through a vibration isolating mechanism.

51. An apparatus according to claim 45, further comprising a base having the reference plane and being supported independently through said barrel support member and a vibration isolating mechanism.

52. A device manufacturing method, comprising the steps of:
   providing an exposure apparatus as recited in claim 45; and
   transferring a reticle pattern to a wafer with the exposure apparatus.

53. A positioning system according to claim 38, wherein said position measuring device selectively measures a reflection beam from any one of said inclined reflection surfaces, on the basis of positional information of said movable member.

54. A positioning system according to claim 38, wherein any one of measurement beams projected or to be projected on said inclined reflection surfaces is blocked.

55. A positioning system according to claim 38, further comprising a shutter for blocking the measurement beam.

56. A positioning system according to claim 38, wherein initialization of a measured value for at least one of the reflection surfaces is performed when measurements using two reflection surfaces can be made.

57. A position measuring method for measuring the position of a movable member being movable along a reference plane, said method comprising the steps of:
   projecting a measurement beam onto an optical element mounted on the movable member, along a direction parallel to the reference plane, wherein the movable member includes a plurality of elements each having a reflection surface inclined with respect to the reference plane; and
   measuring, using a position measuring device, the position of the movable member with respect to a direction perpendicular to the reference plane, by use of a beam deflected by the optical element in a direction intersecting the reference plane, wherein the position measuring device selectively measures a reflection beam from any one of the inclined reflection surfaces.

58. A method according to claim 57, further comprising reflecting, with a fixed reflecting portion, the deflected beam in a direction opposite to a beam path of the deflected beam, and measuring the position of the movable member with respect to a direction perpendicular to the reference plane.

59. A method according to claim 57, wherein the optical element includes a mirror member having an inclined reflection surface.

60. A method according to claim 57, wherein the optical element includes a diffraction grating.

61. A method according to claim 60, further comprising measuring a phase change of diffraction light produced by the diffraction grating to thereby measure the position of the movable member with respect to a direction perpendicular to the reference plane.

62. A method according to claim 57, further comprising selectively performing measurement with use of any one of the optical elements in accordance with positional information of the movable member.

63. A method according to claim 57, further comprising measuring positions at plural locations on the movable member with respect to a direction perpendicular to the reference plane, whereby rotational information of the movable member in a direction inclined with respect to the reference plane and positional information in a direction perpendicular to the reference plane are detected.

* * * * *

UNITED STATES PATENT AND TRADEMARK OFFICE
CERTIFICATE OF CORRECTION

PATENT NO. : 6,285,444 B1
DATED : September 4, 2001
INVENTOR(S) : Eiji Osanai et al.

It is certified that error appears in the above-identified patent and that said Letters Patent is hereby corrected as shown below:

Title page,
Item [57], ABSTRACT, the existing Abstract should be deleted and the following Abstract inserted therefor:
-- A positioning system includes a movable member being movable along a reference plane, and including a plurality of elements each having a reflection surface inclined with respect to the reference plane, and a position measuring device for measuring positional information related to the movable member, the position measuring device including a measurement device for causing a measurement beam to be reflected by the inclined reflection surfaces and for detecting positional information related to the movable member with respect to a direction intersecting the reference plane. The position measuring device selectively measures a reflection beam from any one of the inclined reflection surfaces. --

Drawings,
Fig. 28, in "(STEP 24)" "ION IMPLANTAION" should read -- ION IMPLANTATION --.

Column 7,
Line 7, "eight" should read -- eighth --.
Line 53, "wafer" should read -- a wafer --.

Column 8,
Line 8, "32a" should read -- 33a, --.
Line 27, "32a" should read -- 33a, --.
Line 33, "32a, 32b," should read -- 33a, 33b, --.

Column 9,
Line 19, "32a," should read -- 33a, --.

Column 11,
Line 42, "32a, 32b," should read -- 33a, 33b --.

Column 12,
Line 1, "32a, 32b," should read -- 33a, 33b --.
Line 55, "32a," should read -- 33a, --.

Column 16,
Line 38, "structure, not shown," should read -- structure (not shown), --.

Column 18,
Line 27, "132b," should read -- 133b, --.
Line 53, "132b," should read -- 133b, --.

UNITED STATES PATENT AND TRADEMARK OFFICE
CERTIFICATE OF CORRECTION

| | |
|---|---|
| PATENT NO. | : 6,285,444 B1 |
| DATED | : September 4, 2001 |
| INVENTOR(S) | : Eiji Osanai et al. |

It is certified that error appears in the above-identified patent and that said Letters Patent is hereby corrected as shown below:

Column 20,
Line 47, "direction" should read -- directions --.

Column 21,
Line 36, "132b," should read -- 133b, --.
Line 63, "132b," should read -- 133b, --.

Column 27,
Line 54, "preprocess" should read -- pre-process --.

Signed and Sealed this

Ninth Day of April, 2002

Attest:

JAMES E. ROGAN
Attesting Officer
Director of the United States Patent and Trademark Office